(12) United States Patent
Matsuda et al.

(10) Patent No.: US 9,728,938 B2
(45) Date of Patent: Aug. 8, 2017

(54) OPTICAL SEMICONDUCTOR DEVICE, OPTICAL SEMICONDUCTOR DEVICE ARRAY, AND OPTICAL TRANSMITTER MODULE

(71) Applicant: FUJITSU LIMITED, Kawasaki-shi, Kanagawa (JP)

(72) Inventors: Manabu Matsuda, Atsugi (JP); Ayahito Uetake, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 66 days.

(21) Appl. No.: 14/486,047

(22) Filed: Sep. 15, 2014

(65) Prior Publication Data
US 2015/0093121 A1 Apr. 2, 2015

(30) Foreign Application Priority Data
Oct. 2, 2013 (JP) .................. 2013-207304

(51) Int. Cl.
*H01S 5/125* (2006.01)
*H01S 5/12* (2006.01)
(Continued)

(52) U.S. Cl.
CPC ............. *H01S 5/125* (2013.01); *H01S 5/124* (2013.01); *H01S 5/0268* (2013.01); *H01S 5/22* (2013.01);
(Continued)

(58) Field of Classification Search
CPC ................................ H01S 5/124; H01S 5/125
See application file for complete search history.

(56) References Cited

U.S. PATENT DOCUMENTS 4,794,618 A * 12/1988 Mito .................. H01S 5/12
372/102
4,796,273 A * 1/1989 Yamaguchi ............... H01S 5/12
372/50.11
(Continued)

FOREIGN PATENT DOCUMENTS

| JP | S63-166282 A | 7/1988 |
|---|---|---|
| JP | 2000-58970 | 2/2000 |
| JP | 2010-251609 A | 11/2010 |
| WO | WO 2010/100738 A1 | 9/2010 |

OTHER PUBLICATIONS

Japanese Patent Application No. 2013-207304: Notification of Reasons for Refusal dated Mar. 7, 2017.

*Primary Examiner* — Tod T Van Roy
*Assistant Examiner* — Sean Hagan
(74) *Attorney, Agent, or Firm* — Kratz, Quintos & Hanson, LLP

(57) ABSTRACT

An optical semiconductor device includes: an active region which includes an active layer which produces light when current is injected therein, a first diffraction grating layer having a first diffraction grating with a prescribed grating period, and a phase shift portion formed within the first diffraction grating layer, wherein the phase shift portion provides a phase shift not smaller than $1.5\pi$ but not larger than $1.83\pi$; and a distributed reflection mirror region which is optically coupled to a first end of the active region as viewed along a direction of an optical axis, and which includes a second diffraction grating which reflects the light produced by the active region back into the active region.

10 Claims, 28 Drawing Sheets

(51) Int. Cl.
    *H01S 5/026*    (2006.01)
    *H01S 5/22*     (2006.01)
    *H01S 5/40*     (2006.01)
    *H01S 5/227*    (2006.01)

(52) U.S. Cl.
    CPC ........... *H01S 5/2275* (2013.01); *H01S 5/4012* (2013.01); *H01S 5/4087* (2013.01)

(56) References Cited

U.S. PATENT DOCUMENTS

| | | | | |
|---|---|---|---|---|
| 4,805,183 | A * | 2/1989 | Kudo | H01S 5/10 372/50.11 |
| 4,894,834 | A * | 1/1990 | Kakimoto | B82Y 20/00 372/44.01 |
| 5,561,682 | A * | 10/1996 | Aoki | H01S 5/0265 372/26 |
| 5,878,066 | A * | 3/1999 | Mizutani | H01S 5/12 372/27 |
| 5,960,023 | A * | 9/1999 | Takahashi | H01S 5/1228 372/50.11 |
| 6,587,619 | B1 | 7/2003 | Kinoshita | |
| 2007/0280321 | A1* | 12/2007 | Kitamura | H01S 5/12 372/50.11 |
| 2010/0260220 | A1* | 10/2010 | Yoffe | H01S 5/06258 372/38.02 |
| 2010/0265980 | A1* | 10/2010 | Matsuda | H01S 5/06258 372/46.01 |
| 2011/0299561 | A1 | 12/2011 | Akiyama | |

* cited by examiner

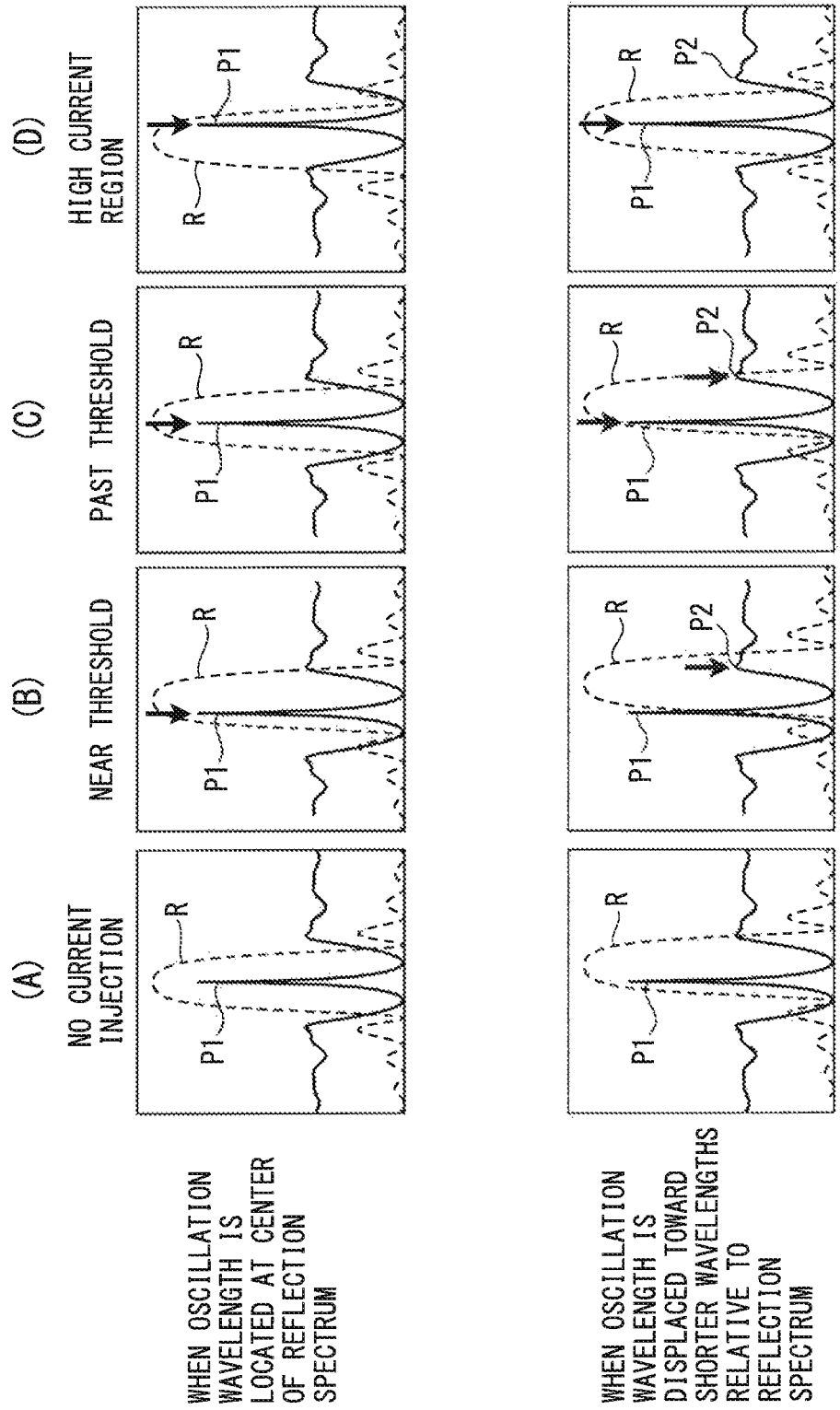

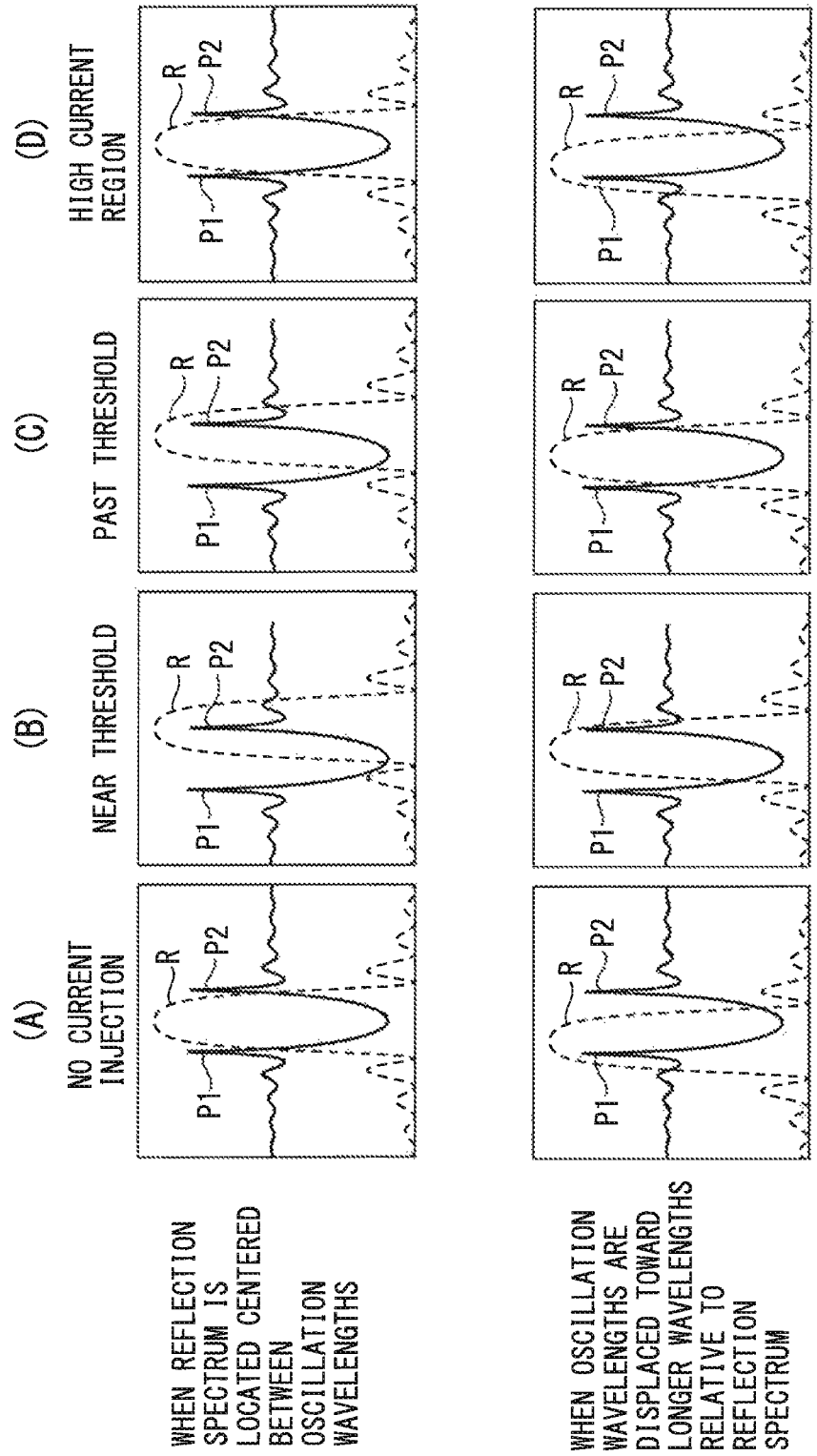

FIG. 9

| SAMPLE NO. | AMOUNT OF PHASE SHIFT | | | | | | | | | | |
|---|---|---|---|---|---|---|---|---|---|---|---|
| | 0 | 0.17π | 0.33π | 0.5π | 0.67π | π | 1.33π | 1.50π | 1.67π | 1.83π | |
| | 0 | λ/24 | λ/12 | λ/8 | λ/6 | λ/4 | λ/3 | 3λ/8 | 5λ/12 | 11λ/24 | |
| 1 | ○ | × | × | × | × | ○ | ○ | ○ | ○ | ○ | |
| 2 | ○ | × | × | × | × | × | ○ | ○ | ○ | ○ | |
| 3 | × | × | × | × | × | × | ○ | ○ | ○ | ○ | |
| 4 | ○ | ○ | × | × | × | × | ○ | ○ | ○ | ○ | |
| 5 | ○ | ○ | × | × | × | × | ○ | ○ | ○ | ○ | |
| 6 | ○ | × | × | × | × | × | ○ | ○ | ○ | ○ | |
| 7 | ○ | | | | | | | ○ | — | — | |

OPTICAL SEMICONDUCTOR DEVICE, OPTICAL SEMICONDUCTOR DEVICE ARRAY, AND OPTICAL TRANSMITTER MODULE

CROSS-REFERENCE TO RELATED APPLICATIONS

This application is based upon and claims the benefit of priority of the prior Japanese Patent Application No. 2013-207304, filed on Oct. 2, 2013, the entire contents of which are incorporated herein by reference.

FIELD

The present invention relates to an optical semiconductor device, an optical semiconductor device array, an optical transmitter module, and an optical transmission system.

BACKGROUND

Conventionally, optical semiconductor devices such as semiconductor lasers are used in the field of communications. With the proliferation of the Internet and other communications networks, the amount of communication traffic has been increasing and, to address the increasing amount of traffic, work aimed at increasing communication speeds and communication capacities in optical communications or optical transmissions using such optical semiconductor devices has been proceeding.

For example, there has developed a need for an optical fiber transmission system that achieves a communication speed of 40 Gb/s or higher or for a system capable of transmitting data amounting to 100 gigabits in traffic by bundling together four waves, each 25 gigabits of data, using a LAN-WDM.

It is believed that semiconductor lasers can be used to generate optical signals for such communications by direct modulation. One example of such a semiconductor laser is a distributed feedback laser (DFB laser) which incorporates a diffraction grating in the active region.

To perform direct modulation at high frequency using a DFB laser, a high relaxation oscillation frequency is needed. In the DFB laser, the relaxation oscillation frequency can be increased by reducing the volume of the active region of the semiconductor laser. For example, there is proposed a DFB laser capable of modulating at 40 Gb/s at room temperature by reducing the length of the laser resonator to 100 μm.

On the other hand, in order to increase the efficiency and the relaxation oscillation frequency of the DFB laser and to cause it to oscillate in a single longitudinal mode, there is proposed a distributed reflection laser (DR laser) equipped with distributed reflection mirrors and having a phase shift portion and a diffraction grating for causing light produced by the active region to be reflected back into the active region.

FIG. 1 is diagram illustrating an optical semiconductor device as a DR laser.

The optical semiconductor device 110 is a DR laser. The optical semiconductor device 110 includes a first distributed reflection mirror region 110a, an active region 110b, and a second distributed reflection mirror region 110c.

The active region 110b includes a substrate 111, a first lower cladding layer 112 formed on the substrate 111, a first diffraction grating layer 113 formed on the first lower cladding layer 112, and a grating phase shift portion 114 (hereinafter, "a phase shift" means "a grating phase shift" in the present specification and drawings) formed within the first diffraction grating layer 113 and providing a phase shift of π radians. A second lower cladding layer 115 is formed on the first diffraction grating layer 113, an active layer 116 is formed on the second lower cladding layer 115, and an upper cladding layer 117 is formed on the active layer 116. A first electrode layer 120 is formed on the upper cladding layer 117, and a second electrode layer 121 is formed on the underside of the substrate 111. The first and second electrode layers 120 and 121 act to inject current into the active layer 116. The substrate 111, the first lower cladding layer 112, the second lower cladding layer 115, and the upper cladding layer 117 each extend into the first and second distributed reflection mirror regions 110a and 110c.

The first and second distributed reflection mirror regions 110a and 110c each include a second diffraction grating layer 122 formed on the first lower cladding layer 112, the second lower cladding layer 115 formed on the second diffraction grating layer 122, and an optical guide layer 123 formed on the second lower cladding layer 115. The second diffraction grating layer 122 is formed integrally with the first diffraction grating layer 113, and has a diffraction grating having the same grating period as that of the first diffraction grating layer 113. The optical guide layer 123 is optically coupled to the active layer 116.

A first antireflection layer 128 is applied to cover an open end of the first distributed reflection mirror region 110a, and a second antireflection layer 129 is applied to cover an open end of the second distributed reflection mirror region 110c.

The active layer 116 in the active region 110b produces light when current is injected into it. The first and second distributed reflection mirror regions 110a and 110c on both sides of the active region 110b cause the light produced by the active region 110b to be reflected back into the active region 110b. The active region 110b produces laser light having a wavelength with a period twice that of the diffraction grating formed in the first diffraction grating layer 113. The laser light produced by the active region 110b propagates through the optical, guide layers 123 on both sides and is output from both end faces of the optical semiconductor device 110.

International Publication Pamphlet No. WO2010/100738
Japanese Laid-open Patent Publication No. 2000-58970
K. Nakahara et al., "High Extinction Ratio Operation at 40-Gb/s Direct Modulation in 1.3-μm InGaAlAs-MQW RWG DFB Lasers," OFC/NFOEC 2006, OWC5

SUMMARY

In the optical semiconductor device depicted in FIG. 1, the composition of the active layer 116 and the layer thickness may deviate from their design values due to manufacturing variations, etc.

FIG. 2 is a diagram illustrating the relationship between optical output and drive current for an optical semiconductor device as a DR laser.

As depicted in FIG. 2, the optical semiconductor device that develops abnormal oscillation such as described above may exhibit a kink in the optical output such that the optical output abruptly drops while the drive voltage is being increased.

It is believed that such abnormal oscillation occurs because the oscillation wavelength of the active region 110b becomes displaced with respect to the reflection spectrum of the first or second distributed reflection mirror region 110a or 110c, causing such abnormality as a mode jumping or mode contention.

Next, how such abnormal oscillation can occur will be described below with reference to drawings.

First, a description will be given by taking as an example a DR laser having a phase shift portion.

FIG. 3A is a diagram illustrating the relationships between oscillation wavelength and reflection spectrum for an optical semiconductor device as a DR laser having a phase shift portion that provides a phase shift of π radians.

FIG. 3A illustrates the relationships between the principal oscillation mode P1 and the reflection spectrum R for the case where the principal oscillation mode P1 is located at the center of the reflection spectrum R and for the case where the principal oscillation mode P1 is displaced toward shorter wavelengths relative to the reflection spectrum R. The principal oscillation mode P1 is determined primarily by the composition wavelength of the active layer 116, the phase shift portion 114, and the period of the diffraction grating of the first diffraction grating layer 113. The reflection spectrum R is determined primarily by the composition of the optical guide layer 123 and the period of the diffraction grating of the second diffraction grating layer 122.

First, a description will be given for the case where the optical semiconductor device is formed according to the design so that the principal oscillation mode P1 is located at the center of the reflection spectrum R. When no current is injected into the active layer 116 (condition A), the principal oscillation mode P1 of the optical semiconductor device 110 having the phase shift portion is located at the center of the reflection spectrum. The wavelength of the principal oscillation mode refers to the wavelength at which the optical semiconductor device 110 is designed to oscillate.

Next, when the current injected into the active layer 116 is increased to a value near the threshold current (condition B), the principal oscillation mode P1 moves toward shorter wavelengths as the carrier concentration in the active layer 116 increases. Since the principal oscillation mode P1 is located within the reflection spectrum R, the optical semiconductor device 110 starts oscillating in the principal oscillation mode P1.

When the current injected into the active layer 116 is further increased past the threshold current (condition C), the carrier concentration in the active layer 116 remains constant, but since the refractive index changes as the temperature of the active layer 116 rises due to Joule heating caused by the current, the principal oscillation mode P1 moves toward longer wavelengths. Since the principal oscillation mode P1 is located within the reflection spectrum R, the optical semiconductor device 110 continues to oscillate in the principal oscillation mode P1.

When the current injected into the active layer 116 is further increased to enter a high current region (condition D), the principal oscillation mode P1 further moves toward longer wavelengths. Since the principal oscillation mode P1 remains within the reflection spectrum R, the optical semiconductor device 110 continues to oscillate in the principal oscillation mode P1.

Next, a description will be given for the case where the principal oscillation mode P1 is displaced toward shorter wavelengths relative to the reflection spectrum R.

First, when no current is injected into the active layer 116 (condition A), the principal oscillation mode P1 of the optical semiconductor device 110 is located in the shorter wavelength part of the reflection spectrum R. Such positional displacement of the principal oscillation mode P1 relative to the reflection spectrum R can occur when the composition of the active layer 116 or the layer thickness varies due to manufacturing variations, etc.

Next, when the current injected into the active layer 116 is increased to a value near the threshold current (condition B), the principal oscillation mode P1 moves toward shorter wavelengths. Since the principal oscillation mode P1 moves outside the reflection spectrum R, the optical semiconductor device 110 does not oscillate in the principal oscillation mode P1. On the other hand, one sub-mode P2 in the stop band moves into the reflection spectrum R, so that the optical semiconductor device 110 starts oscillating in the sub-mode P2.

When the current injected into the active layer 116 is further increased past the threshold current (condition C), the principal oscillation mode P1 moves toward longer wavelengths, and is thus located within the reflection spectrum R; as a result, the optical semiconductor device 110 starts oscillating in the principal oscillation mode P1. A mode jumping from the sub-mode P2 to the principal oscillation mode P1 occurs here. At this time, if the optical output drops, a kink such as depicted in FIG. 2 occurs. On the other hand, if the sub-mode P2 remains within the reflection spectrum R, a mode contention between the sub-mode P2 and the principal oscillation mode P1 may occur in the optical semiconductor device 110.

When the current injected into the active layer 116 is further increased to enter a high current region. (condition D), the principal oscillation mode P1 further moves toward longer wavelengths. Since the principal oscillation mode P1 remains within the reflection spectrum R, the optical semiconductor device 110 continues to oscillate in the principal oscillation mode P1. Since the sub-mode P2 moves outside the reflection spectrum R, the mode contention stops.

Next, a description will be given by taking as an example a DR laser having no phase shift portion.

FIG. 3B is a diagram illustrating the relationships between oscillation wavelength and reflection spectrum for an optical semiconductor device as a DR laser having no phase shift portion. The structure of the optical semiconductor device having no phase shift portion differs from that of the optical semiconductor device depicted in FIG. 1 by the omission of the phase shift portion.

First, a description will be given for the case where the reflection spectrum is located centered between two oscillation wavelengths. In the optical semiconductor device having no phase shift portion, when no current is injected into the active layer (condition A), the reflection spectrum R is located centered between two oscillation modes P1 and P2, i.e., principal oscillation modes, of the stop band.

Next, when the current injected into the active layer is increased to a value near the threshold current (condition B), the two oscillation modes P1 and P2 move toward shorter wavelengths as the carrier concentration in the active layer increases. The oscillation mode P1 on the shorter wavelength side moves outside the reflection spectrum R, while the oscillation mode P2 on the longer wavelength side moves into the reflection spectrum R; as a result, the optical semiconductor device starts oscillating in the oscillation mode P2.

When the current injected into the active layer is further increased past the threshold current (condition C), the two oscillation modes P1 and P2 move toward longer wavelengths, because the refractive index changes as the temperature of the active layer rises due to Joule heating caused by the current. The optical semiconductor device continues to oscillate in the oscillation mode P2.

When the current injected into the active layer is further increased to enter a high current region (condition D), the two oscillation modes P1 and P2 further move toward longer wavelengths. Here again, the reflection spectrum R is located centered between the two oscillation modes P1 and P2 of the stop band, and a mode contention between the two oscillation modes P1 and P2 occurs in the optical semiconductor device. When transitioning from the condition (C) to the condition (D), a mode jumping from the oscillation mode P2 to the oscillation mode P1 may occur.

Next, a description will be given for the case where the oscillation wavelengths are displaced toward longer wavelengths relative to the reflection spectrum.

First, when no current is injected into the active layer (condition A), the oscillation mode P2 on the longer wavelength side is located outside the reflection spectrum, but the oscillation mode P1 on the shorter wavelength side is located within the reflection spectrum R. Such positional displacement of the oscillation wavelengths relative to the reflection spectrum R can occur when the composition of the active layer or the layer thickness varies due to manufacturing variations, etc.

Next, when the current injected into the active layer is increased to a value near the threshold current (condition B), the two oscillation modes P1 and P2 move toward shorter wavelengths, The oscillation mode P1 on the shorter wavelength side moves outside the reflection spectrum R, while the oscillation mode P2 on the longer wavelength side moves into the reflection spectrum R; as a result, the optical semiconductor device starts oscillating in the oscillation mode P2.

When the current injected into the active layer is further increased past the threshold current (condition C), the two oscillation modes P1 and P2 move toward longer wavelengths. The reflection spectrum R is now located centered between the two oscillation modes P1 and P2 of the stop band, and a mode contention between the two oscillation modes P1 and P2 occurs in the optical semiconductor device. When transitioning from the condition (B) to the condition (C), a mode jumping from the oscillation mode P2 to the oscillation mode P1 may occur.

When the current injected into the active layer is further increased to enter a high current region (condition D), the two oscillation modes P1 and P2 further move toward longer wavelengths. The oscillation mode P2 on the longer wavelength side moves outside the reflection spectrum R, while the oscillation mode P1 on the shorter wavelength side moves into the reflection spectrum R; as a result, the optical semiconductor device continues to oscillate in the oscillation mode P1. When transitioning from the condition (C) to the condition (D), a mode jumping from the oscillation mode P2 to the oscillation mode P1 may occur.

Any optical semiconductor device that exhibits abnormal oscillation when the drive current is varied within the operating range, as described above, will be rendered defective, a factor that can decrease fabrication yields.

In particular, when fabricating an optical semiconductor device array by forming a plurality of optical semiconductor devices in monolithic form on a single substrate, if any one of the optical semiconductor devices exhibits abnormal oscillation, the whole array will be rendered defective.

There is therefore a need for an optical semi conductor device that has high tolerance to manufacturing variations, etc., and that is resistant to abnormal oscillation such as a mode jumping or mode contention.

An object of the present invention is to provide an optical semiconductor device that solves the above problem.

According to an aspect of the embodiment disclosed in this specification, there is provided an optical semiconductor device that includes: an active region which includes an active layer which produces light when current is injected therein, a first diffraction grating layer having a first diffraction grating with a prescribed grating period, and a phase shift portion formed within the first diffraction grating layer, wherein the phase shift portion provides a phase shift not smaller than $1.5\pi$ radians but not larger than $1.83\pi$ radians; and a distributed reflection mirror region which is optically coupled to a first end of the active region as viewed along a direction of an optical axis, and which includes a second diffraction grating which reflects the light produced by the active region back into the active region.

According to an aspect of the embodiment disclosed in this specification, there is provided an optical semiconductor device array that includes: a substrate; a first optical device unit arranged on the substrate, the first optical device unit containing a first active region which includes a first active layer which produces light when current is injected therein, a first diffraction grating layer having a first diffraction grating with a first grating period, and a first phase shift portion formed within the first diffraction grating layer, wherein the first phase shift portion provides a phase shift not smaller than $1.5\pi$ radians but not larger than $1.83\pi$ radians, and a first distributed reflection mirror region which is optically coupled to a first end of the first active region, and which includes a second diffraction grating which reflects the light produced by the first active region back into the first active region; and a second optical device unit arranged side by side with the first optical device unit on the substrate, the second optical device unit containing a second active region which includes a second active layer which produces light when current is injected therein, a third diffraction grating layer having a third diffraction grating with a second grating period, and a second phase shift portion formed within the third diffraction grating layer, wherein the second phase shift portion provides a phase shift not smaller than $1.5\pi$ radians but not larger than $1.83\pi$ radians, and a second distributed reflection mirror region which is optically coupled to a first end of the second active region, and which includes a fourth diffraction grating which reflects the light produced by the second active region back into the second active region.

According to an aspect of the embodiment disclosed in this specification, there is provided an optical transmitter module that includes: an optical semiconductor device, the optical semiconductor device containing an active region which includes an active layer which produces light when current is injected therein, a first diffraction grating layer having a first diffraction grating with a prescribed grating period, and a phase shift portion formed within the first diffraction grating layer, wherein the phase shift portion provides a phase shift not smaller than $1.5\pi$ radians but not larger than $1.83\pi$ radians, and a distributed reflection mirror region which is optically coupled to a first end of the active region, and which includes a second diffraction grating which reflects the light produced by the active region back into the active region; and a driving unit which injects current into the active layer.

According to an aspect of the embodiment disclosed in this specification, there is also provided an optical transmitter/receiver module that includes: an optical transmitter module that includes an optical semiconductor device, the optical semiconductor device containing an active region which includes an active layer which produces light when current is injected therein, a first diffraction grating layer having a first diffraction grating with a prescribed grating period, and a phase shift portion formed within the first diffraction grating layer, wherein the phase shift portion provides a phase shift not smaller than 1.5π radians but not larger than 1.83π radians, and a distributed reflection mirror region which is optically coupled to a first end of the active region, and which includes a second diffraction grating which reflects the light produced by the active region back into the active region; an optical fiber through which the light output from the optical transmitter module is transmitted; and an optical receiver module which receives the light transmitted through the optical fiber.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3A is a diagram illustrating the relationships between oscillation wavelength and reflection spectrum for a DR laser having a phase shift portion.

FIG. 3B is a diagram illustrating the relationships between oscillation wavelength and reflection spectrum for a DR laser having no phase shift portion.

FIG. 9 is a diagram illustrating the results obtained by examining the relationships between amount of phase shift and occurrence of abnormal oscillation.

DESCRIPTION OF EMBODIMENTS

A first preferred embodiment of an optical semiconductor device disclosed in this specification will be described below with reference to drawings. However, it will be noted that the technical scope of the present invention is not limited by any particular embodiment described herein but extends to the inventions described. in the appended claims and their equivalents.

Figure 1:
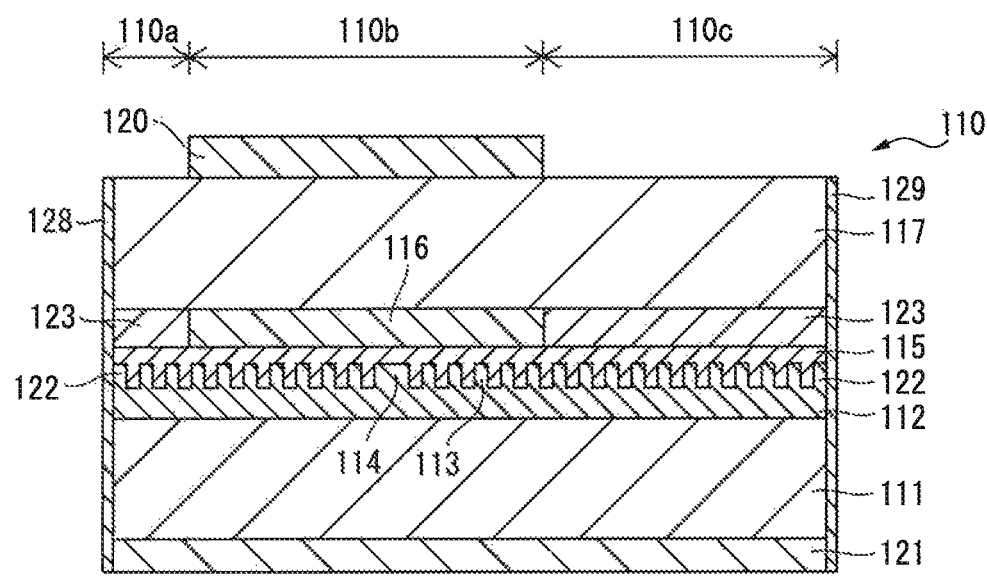
FIG. 1 is a diagram illustrating a DR laser.
Figure 2:
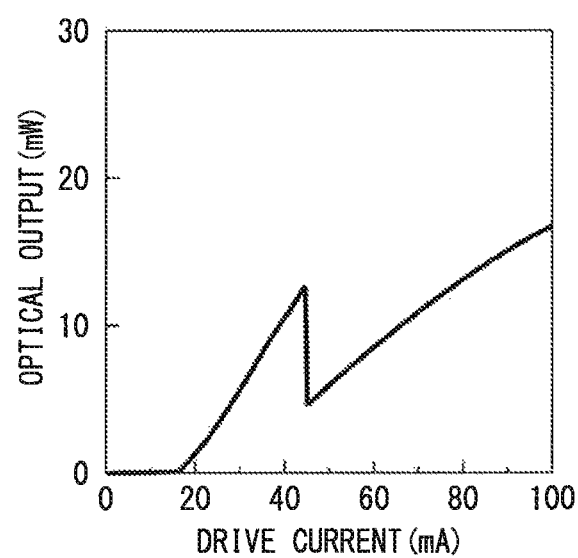
FIG. 2 is a diagram illustrating the relationship between optical output and drive current for a DR laser.
Figure 4:
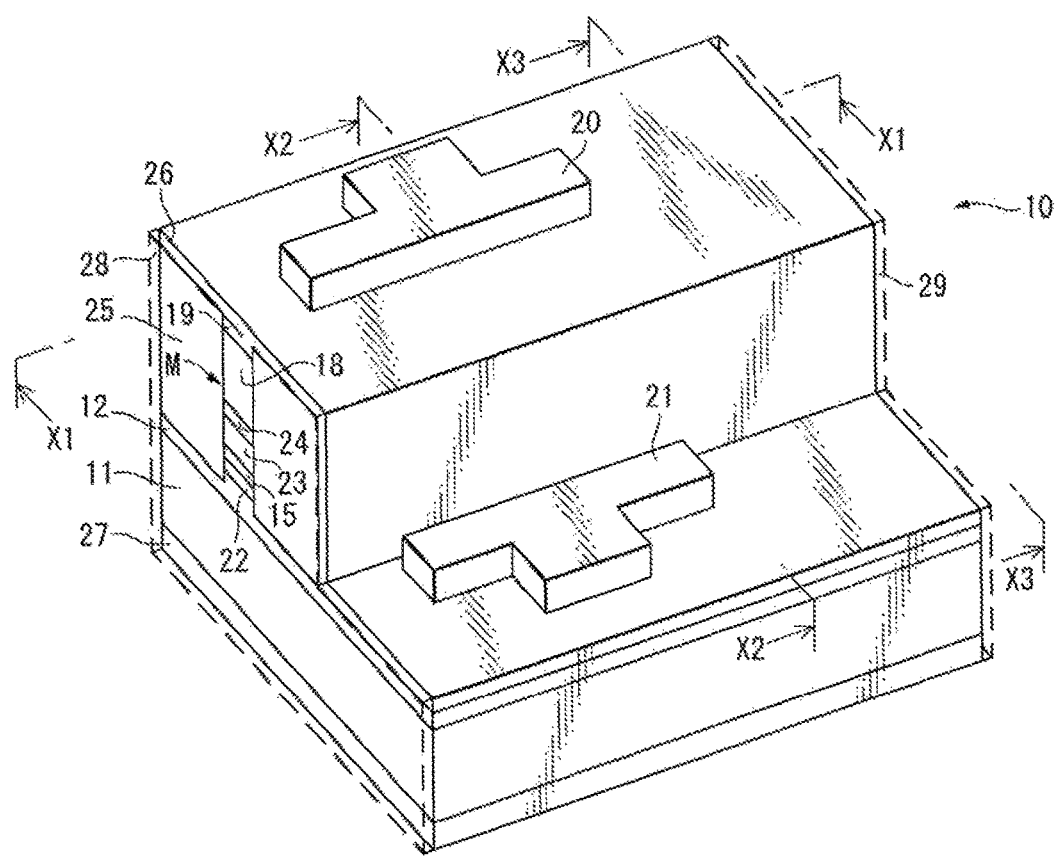
FIG. 4 is a perspective view illustrating a first embodiment of an optical semiconductor device disclosed in this specification.
Figure 5:
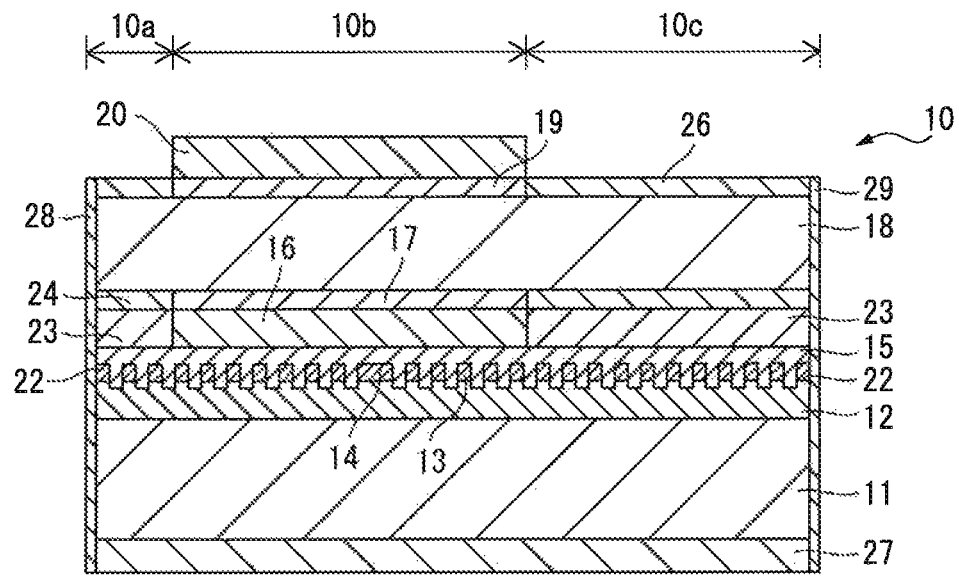
FIG. 5 is a cross-sectional view taken, along line X1-X1 in FIG. 4.
Figure 6:
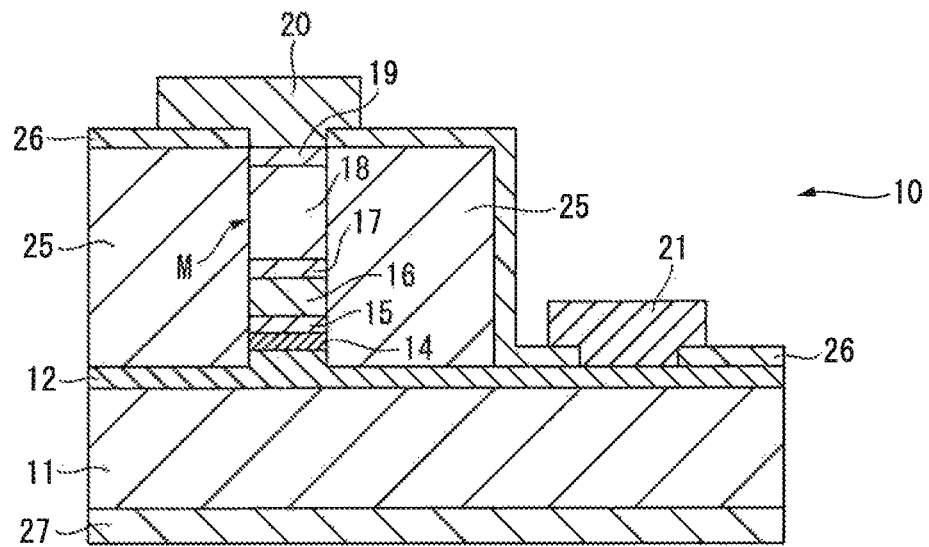
FIG. 6 is a cross-sectional view taken along line X2-X2 in FIG. 4.
Figure 7:
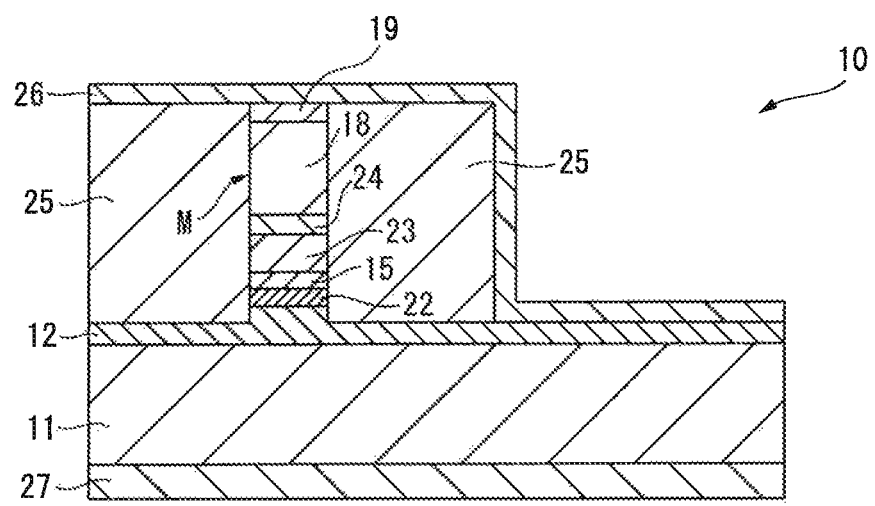
FIG. 7 is a cross-sectional view taken along line X3-X3 in FIG. 4.

FIG. 4 is a perspective view illustrating the first embodiment of the optical semiconductor device disclosed in this specification. FIG. 5 is a cross-sectional view taken along line X1-X1 in FIG. 4. FIG. 6 is a cross-sectional view taken along line X2-X2 in FIG. 4. FIG. 7 is a cross-sectional view taken along line X3-X3 in FIG. 4.

The optical semiconductor device 10 of the present embodiment is a DR laser which includes a first distributed reflection mirror region 10a, an active region 10b, and a second distributed reflection mirror region 10c. The first distributed reflection mirror region 10a is optically coupled to a first end of the active region 10b as viewed along the direction of the optical axis, and the second distributed reflection mirror region 10c is optically coupled to a second end of the active region 10b as viewed along the direction of the optical axis. The direction of the optical axis is the direction along which light produced by the active region 10b propagates.

The optical semiconductor device 10 includes a mesa portion M extending along the direction of the optical axis and current-blocking buried layers 25 burying the mesa portion M from both sides thereof, and thus has a so-called buried heterostructure.

The active region 10b includes a substrate 11, a first lower cladding layer 12 formed on the substrate 11, a first diffraction grating layer 13 formed on the first lower cladding layer 12 and having a diffraction grating with a prescribed grating period, and a phase shift portion 14, formed within the first diffraction. grating layer 13, for shifting the phase of the light propagating through the active region 10b. The substrate 11 and the first lower cladding layer 12 both extend into the first and second distributed reflection mirror regions 10a and 10c.

The phase shift portion 14 provides a phase shift not smaller than 1.5π radians but not larger than 1.83π radians. Since the phase shift portion 14 is formed so as to provide the thus defined phase shift, the optical semiconductor device 10 has high tolerance to manufacturing variations, etc., and is capable of suppressing the occurrence of abnormal oscillation such as a mode jumping or mode contention, though the details will be described later.

Preferably, the phase shift portion 14 is formed in an area within the active region 10b where light concentration is high so that laser light of the desired wavelength can be generated efficiently.

A second lower cladding layer 15 is formed on the first diffraction grating layer 13. The diffraction grating forming the first diffraction grating layer 13 is embedded between the first lower cladding layer 12 and the second lower cladding layer 15, thus forming a so-called buried diffraction grating. The second lower cladding layer 15 extends into the first and second distributed reflection mirror regions 10a and 10c.

An active layer 16 which produces light when current is injected into it is formed on the second lower cladding layer 15. A quantum well structure or a bulk structure can be used for the active layer 16. A compound semiconductor or the like can be used as the material for forming the active layer 16.

A first upper cladding layer 17 is formed on the active layer 16. A second upper cladding layer 18 is formed on the first upper cladding layer 17. The second upper cladding layer 18 extends along the direction of the optical axis into the first and second distributed reflection mirror regions 10a and 10c. A contact layer 19 is formed on the second upper cladding layer 18. A first electrode layer 20 is formed on the contact layer 19.

The mesa portion M is formed from a portion left on the first lower cladding layer 12 in the first distributed reflection mirror region 10a, the active region 10b, and the second distributed reflection mirror region 10c.

When viewed along a direction crossing at right angles to the direction of the optical axis, the substrate 11 and the first lower cladding layer 12 extend under the mesa portion M and the embedding layers 25. The substrate 11 and the first lower cladding layer 12 further extend outwardly from under one of the embedding layers 25. A second electrode layer 21 is formed on the portion of the first lower cladding layer 12 that extends outwardly from this embedding layer 25.

The first and second electrode layers 20 and 21 act to inject current into the active layer 16.

The underside of the substrate 11 is covered with a bonding layer 27 for bonding to another member.

The first and second distributed reflection mirror regions 10a and 10c each include a second diffraction grating layer 22 formed on the first lower cladding layer 12, and the second lower cladding layer 15 formed on the second diffraction grating layer 22. An optical guide layer 23 is formed on the second lower cladding layer 15. The optical guide layer 23 is optically coupled to the active layer 16. A third upper cladding layer 24 is formed on the optical guide layer 23, and the second upper cladding layer 18 is formed on the third upper cladding layer 24.

The second diffraction grating layer 22 has a diffraction grating having the same grating period as that of the first diffraction grating layer 13. From the standpoint that the first and second distributed reflection mirror regions 10a and 10c have the same beam coupling coefficient as the active region 10b, it is preferable that the depth of grooves forming the diffraction grating of the second diffraction grating layer 22 is made the same as that of grooves forming the diffraction grating of the first diffraction grating layer 13. In the optical semiconductor device 10, the second diffraction grating layer 22 is formed integrally with the first diffraction grating layer 13.

A first antireflection layer 28 is applied to cover an open end of the first distributed reflection mirror region 10a, and a second antireflection layer 29 is applied to cover an open end of the second distributed reflection mirror region 10c. In FIG. 4, the first and second antireflection layers 28 and 29 are indicated by dashed lines.

The mesa portion M extends through the first distributed reflection mirror region 10a, the active region 10b, and the second distributed reflection mirror region 10c. The active region 16 and the optical guide layers 23 are contained in the mesa portion M. Preferably, the buried layers 25 have electrically semi-insulating or insulating properties, and act to confine the current within the mesa portion M and inject it into the active region 16.

The mesa portion M and the buried layers 25 are covered with a passivation layer 26. The first lower cladding layer 12 extending outwardly from under the buried layer 25 is also covered with the passivation layer 26.

The active layer 16 in the active region 10b produces light when current is injected into it. The first and second distributed reflection mirror regions 10a and 10c on both sides of the active region 10b in the direction of the optical axis cause the light produced by the active region 10b to be reflected back into the active region 10b. The active region 10b produces laser light having a wavelength with a period twice that of the diffraction grating formed in the first diffraction grating layer 13. The laser light produced by the active region 10b propagates through the optical guide layers 23 and is output from both end faces of the optical semiconductor device 10.

Next, the operation of the optical semiconductor device 10 will be described below with reference to drawings.

Figure 8:
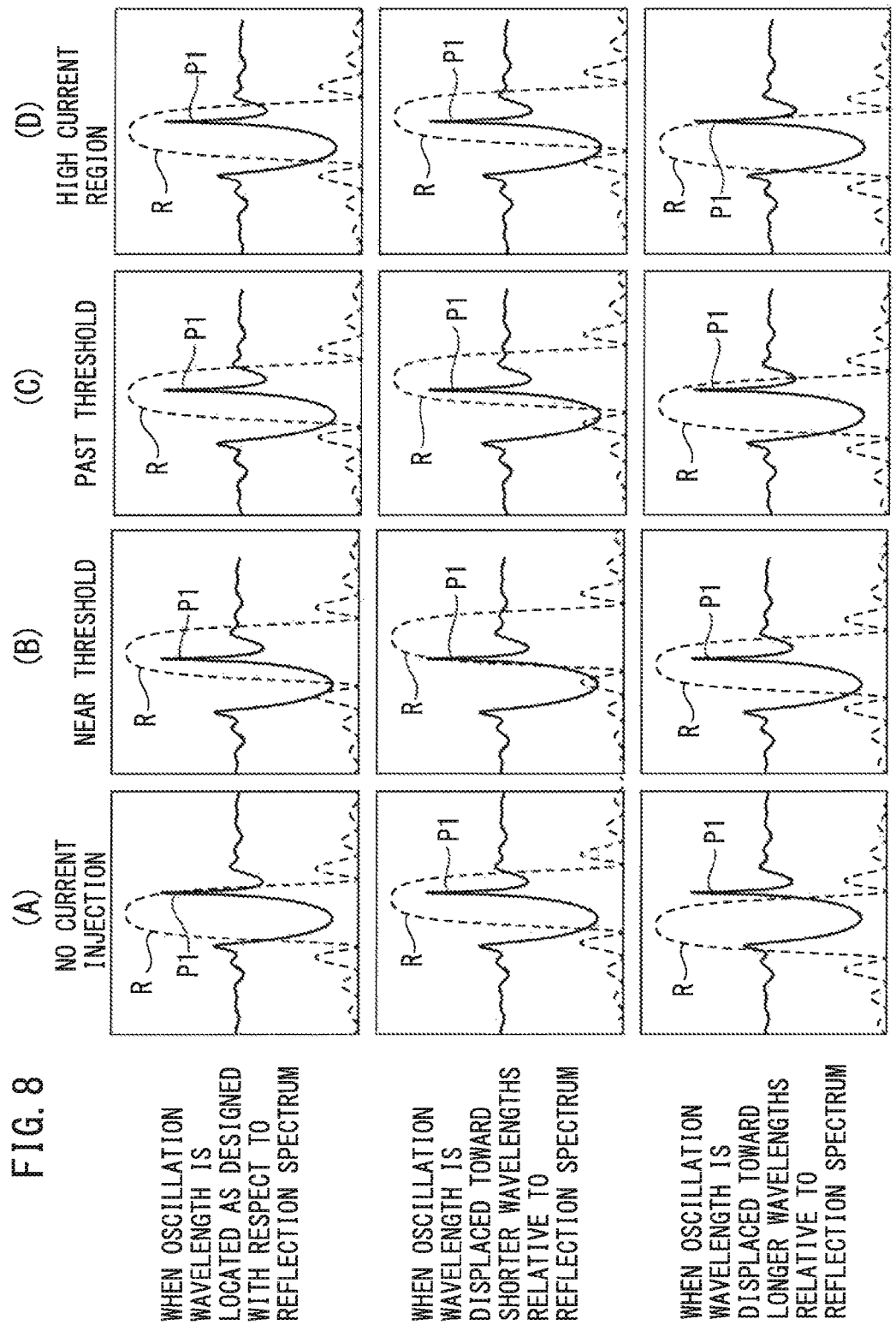
FIG. 8 is a diagram illustrating the relationships between oscillation wavelength and reflection spectrum.

FIG. 8 is a diagram illustrating the relationships between oscillation wavelength and reflection spectrum.

FIG. 8 illustrates the relationships between the principal oscillation mode P1 and the reflection spectrum R for the case where the principal oscillation mode P1 is located as designed with respect to the reflection spectrum R, for comparison with the case where it is displaced toward shorter wavelengths and the case where it is displaced toward longer wavelengths. The principal oscillation mode P1 is determined primarily by the composition wavelength of the active layer 16, the phase shift provided by the phase shift portion 14, and the period, of the diffraction grating of the first diffraction grating layer 13. The reflection spectrum R is determined primarily by the composition of the optical guide layer 23 and the period of the diffraction grating of the second diffraction grating layer 22.

Normally, the reflection spectrum R has approximately same width as the width of the stop band. When the phase shift is $\pi$ radians, the principal oscillation mode P1 is located at the center of the stop band. In the case of the semiconductor layer 10, since the phase shift is in the range of $1.5\pi$ radians to $1.83\pi$ radians and is thus larger than $\pi$ radians, the oscillation wavelength of the principal oscillation mode is located on the longer wavelength side of the center of the stop band.

First, a description will be given for the case where the optical semiconductor device is formed according to the design so that the principal oscillation mode P1 is located as designed with respect to the reflection spectrum R. When no current is injected into the active layer 16 (condition A), the principal oscillation mode P1 of the optical semiconductor device 10 is located on the longer wavelength side of the center of the stop band and lies within the reflection spectrum. R. In the example depicted in FIG. 8 (condition A), the principal oscillation mode P1 is located at the longer wavelength end of the reflection spectrum R.

Next, when the current injected into the active layer 16 is increased to a value near the threshold current (condition B), the principal oscillation mode P1 moves toward shorter wavelengths as the carrier concentration in the active layer 16 increases. Since the principal oscillation mode P1 is located within the reflection spectrum R, the optical semiconductor device 10 starts oscillating in the principal oscillation mode P1.

When the current injected into the active layer 16 is further increased past the threshold current (condition C), the carrier concentration in the active layer 16 remains constant, but since the refractive index changes as the temperature of the active layer 16 rises due to Joule heating caused by the current, the principal. oscillation mode P1 moves toward longer wavelengths. Since the principal oscillation mode P1 is located near the center of the reflection spectrum R, the optical semiconductor device 10 continues to oscillate in the principal oscillation mode P1.

When the current injected into the active layer 16 is further increased to enter a high current region (condition D), the principal oscillation mode P1 further moves toward longer wavelengths. Since the principal oscillation mode P1 remains within the reflection spectrum R, the optical semiconductor device 10 continues to oscillate in the principal oscillation mode P1.

Next, a description will be given for the case where the oscillation wavelength of the principal oscillation mode is displaced toward shorter wavelengths relative to the reflection spectrum R. Such positional displacement of the oscillation wavelength of the principal oscillation mode relative to the reflection spectrum can occur when the composition of the active layer or the layer thickness varies due to manufacturing variations, etc.

First, when no current is injected into the active layer 16 (condition A), the principal oscillation mode P1 of the optical semiconductor device 10 is located on the longer wavelength side of the center of the stop band and lies within the reflection spectrum R.

Next, when the current injected into the active layer 16 is increased to a value near the threshold current (condition B), the principal oscillation mode P1 moves toward shorter wavelengths. The principal oscillation mode P1 is located at the shorter wavelength end of the reflection spectrum R. Since the principal oscillation mode P1 remains within the reflection spectrum R, the optical semiconductor device 10 starts oscillating in the principal oscillation mode P1.

When the current injected into the active layer 16 is further increased past the threshold current (condition C), the principal oscillation mode P1 moves toward longer wavelengths. The principal oscillation mode P1 is slightly shifted away from the center of the reflection spectrum R toward shorter wavelengths but is located within the reflection spectrum R. The optical semiconductor device 10 continues to oscillate in the principal oscillation mode P1.

When the current injected into the active layer 16 is further increased to enter a high current region (condition D), the principal oscillation mode P1 further moves toward longer wavelengths. The principal oscillation mode P1 is located approximately at the center of the reflection spectrum R. The optical semiconductor device 10 continues to oscillate in the principal oscillation mode P1.

Next, a description will be given for the case where the oscillation wavelength of the principal oscillation mode is displaced toward longer wavelengths relative to the reflection spectrum R. Such positional displacement of the oscillation wavelength relative to the reflection spectrum can occur when the composition of the active layer or the layer thickness varies due to manufacturing variations, etc.

First, when no current is injected into the active layer 16 (condition A), the principal oscillation mode P1 of the optical semiconductor device 10 is located outside of the longer wavelength part of the reflection spectrum R.

Next, when the current injected into the active layer 16 is increased to a value near the threshold current (condition B), the principal oscillation mode P1 moves toward shorter wavelengths. The principal oscillation mode P1 is slightly shifted away from the center of the reflection spectrum R toward longer wavelengths but is located within the reflection spectrum R. Since the principal oscillation mode P1 is located within the reflection spectrum R, the optical semiconductor device 10 starts oscillating in the principal oscillation mode P1.

When the current injected into the active layer 16 is further increased past the threshold current (condition C), the principal oscillation mode P1 moves toward longer wavelengths. The principal oscillation mode P1 is located on the longer wavelength side of the center of the stop band and lies within the reflection spectrum R. The optical semiconductor device 10 continues to oscillate in the principal oscillation mode P1.

When the current injected into the active layer 16 is further increased to enter a high current region. (condition D), the principal oscillation mode P1 further moves toward longer wavelengths. The principal oscillation mode P1 is located at the longer wavelength end of the reflection spectrum R. Since the principal oscillation mode P1 is located within the reflection spectrum R, the optical semiconductor device 10 continues to oscillate in the principal oscillation mode P1.

As described above, the position of the principal oscillation mode P1 of the optical semiconductor device 10 relative to the reflection spectrum R changes as the amount of the current injected into the active layer 16 increases. The position of the principal oscillation mode P1 relative to the reflection spectrum R when no current is injected into the active layer 16 may differ from the designed position due to manufacturing variations, etc.

In view of this, in the optical semiconductor device 10, the phase shift portion 14 is formed so as to provide a phase shift not smaller than $1.5\pi$ radians but not larger than $1.83\pi$ radians so that the principal oscillation mode P1 is always located within the reflection spectrum R in the operating region of the optical semiconductor device 10.

If the phase shift in the range of $1.5\pi$ radians to $1.83\pi$ radians is expressed in terms of oscillation wavelength $\lambda$, it can be said that the phase shift portion 14 provides a phase shift in the range of $3\lambda/8$ to $11\lambda/24$.

If the width of the reflection spectrum R is increased, the principal oscillation mode P1 that changes with the drive current can be made to fall within the reflection spectrum R with greater ease. In view of this, the depth of grooves forming the diffraction grating of the second diffraction grating layer 22 in the first distributed reflection mirror region 10a or the second distributed reflection mirror region 10c may be made greater than that of grooves forming the diffraction grating of the first diffraction grating layer 13.

Next, a description will be given of the results of measurements that verify that the phase shift portion 14 of the optical semiconductor device 10 that provides the phase shift in the above range serves to suppress abnormal oscillation such as a mode lumping or mode contention.

FIG. 9 is a diagram illustrating the results obtained by examining the relationships between the amount of phase shift and the occurrence of abnormal oscillation.

To obtain the results of FIG. 9, optical semiconductor devices containing phase shift portions providing 10 different amounts of phase shift within the range of 0 to $1.83\pi$ radians were fabricated in the form of an array on a single substrate. Seven such optical semiconductor device arrays were fabricated, and the relationships between the optical output and the drive current were measured to examine the presence or absence of abnormal oscillation. Each fabricated optical semiconductor device has the same structure as that depicted in FIGS. 4 to 7.

A quantum well structure was used for the active layer in the optical semiconductor device. The quantum well structure was formed using an undoped AlGaInAs well layer and an undoped AlGaInAs barrier layer. The undoped AlGaInAs well layer was formed to have a thickness of 4.2 nm and a compression strain of 1.0%. The undoped AlGaInAs barrier layer was formed to have a composition wavelength of 1.00 μm and a thickness of 10 nm. The quantum well structure was a 15-layer structure, and its oscillation wavelength was 1310 nm. On the other hand, the optical guide layer in the optical semiconductor device was formed using an undoped GaInAsP layer having a composition wavelength of 1.20 μm and a thickness of 250 nm.

Other conditions, such as the dimensions and materials of the fabricated optical semiconductor devices will be described later in the description of an optical semiconductor device fabrication method.

In FIG. 9, circle indicates that abnormal oscillation such as a kink did not occur in the optical output range up to 30 mW or that abnormal oscillation such as a kink did not occur in the range where the drive current was not larger than 100 mA and where the optical output was not smaller than 20 mW. On the other hand, cross indicates that abnormal oscillation occurred in the above-mentioned range. For the optical semiconductor devices in the seventh sample array whose amounts of phase shift were set to $1.67\pi$ radians and $1.83\pi$ radians, respectively, no measurements were made for abnormal oscillation, because these optical semiconductor devices were lost during the device fabrication process.

According to the results depicted in FIG. 9, no abnormal oscillation was observed when the amount of phase shift was in the range of $1.33\pi$ radians to $1.83\pi$ radians.

Further, according to the results depicted in FIG. 9, in the case of the optical semiconductor devices whose amounts of phase shift were set to 0 radians, $0.17\pi$ radians, and $\pi$ radians, respectively, some optical semiconductor devices exhibited abnormal oscillation and some did not. This is presumably because a difference occurs in the amount of positional shift of the oscillation wavelength relative to the reflection spectrum due to manufacturing variations, etc., as previously described with reference to FIGS. 3A and 3B.

The results depicted in FIG. 9 also indicate that abnormal oscillation was observed on all semiconductors when the amount of phase shift was in the range of $0.33\pi$ radians to $0.67\pi$ radians.

Accordingly, in order to suppress abnormal oscillation, it is preferable that the amount of phase shift to be provided by the phase shift portion is set not smaller than $1.33\pi$ radians but not larger than $1.83\pi$ radians.

More specifically, the lower limit value of the phase shift is preferably set not smaller than $(1.33+1.50)\pi/2$, more preferably not smaller than $1.50\pi$ radians, still more preferably not smaller than $(1.50+1.67)\pi/2$, and yet more preferably not smaller than $1.67\pi/2$. From the standpoint of sufficiently suppressing abnormal oscillation, it is preferable to set the lower limit value of the phase shift larger than $1.50\pi$ radians or not smaller than $1.50\pi$ radians.

On the other hand, the upper limit value of the phase shift is preferably set not larger than $(1.67+1.83)\pi/2$, more preferably not larger than $1.67\pi$, and still more preferably not larger than $(1.50+1.67)\pi/2$.

The optical guide layer in each of the optical semiconductor devices fabricated for the measurements in FIG. 9 was formed using GaInAsP as earlier described. GaInAsP used here is a material having a larger refractive index variation than AlGaInAs used to form the quantum well structure.

Figure 10:
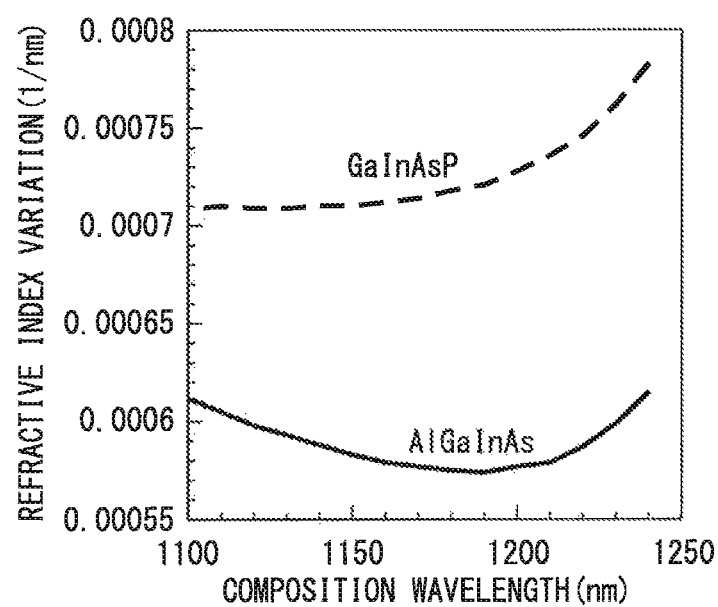
FIG. 10 is a diagram illustrating the relationships between refractive index variation and composition wavelength for GaInAsP and AlGaInAs.

FIG. 10 is a diagram illustrating the relationships between refractive index variation and composition wavelength for GaInAsP and AlGaInAs.

As depicted in FIG. 10, compared with AlGaInAs, GaInAsP is a material that exhibits a relatively large refractive index variation for changes in composition wavelength. The composition wavelength can change as a result of the variation of the composition of the active layer due to manufacturing variations, etc. Therefore, according to the results depicted in FIG. 9, even if GaInAsP whose refractive index varies greatly due to manufacturing variations, etc., is used, the optical semiconductor device can suppress the occurrence of abnormal oscillation by setting the amount of phase shift not smaller than $1.33\pi$ radians but not larger than $1.83\pi$ radians.

Next, the results of the measurements made to assess the relationship between the threshold current and the amount of phase shift, the relationship between the slope efficiency and the amount of phase shift, and the relationship between the relaxation oscillation frequency and the amount of phase shift for the optical semiconductor devices fabricated for the measurements in FIG. 9 will be described below with reference to drawings.

Figure 11:
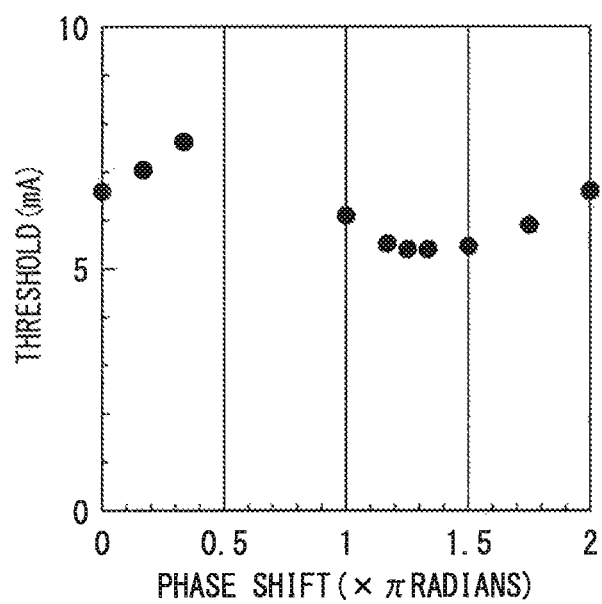
FIG. 11 is a diagram illustrating the relationship between threshold current and amount of phase shift.

FIG. 11 is a diagram illustrating the relationship between the threshold current and the amount of phase shift.

When the amount of phase shift is in the range of $1.5\pi$ radians to $1.83\pi$ radians, the threshold current is lower than when the amount of phase shift is 0 radians, and is not higher than when the amount of phase shift is $\pi$ radians. Accordingly, by setting the amount of phase shift not smaller than $1.5\pi$ radians but not larger than $1.83\pi$ radians, the threshold current can be reduced.

Figure 12:
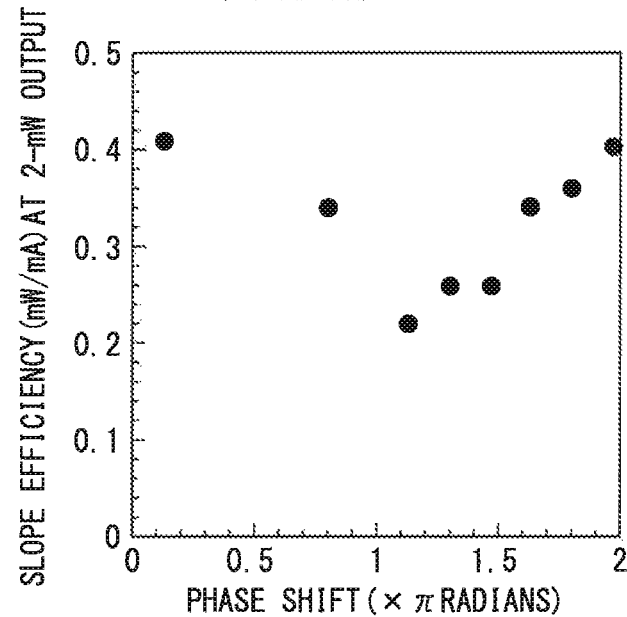
FIG. 12 is a diagram illustrating the relationship between slope efficiency and amount of phase shift.

FIG. 12 is a diagram illustrating the relationship between the slope efficiency at 2-mW output and the amount of phase shift.

When the amount of phase shift is in the range of $1.5\pi$ radians to $1.83\pi$ radians, the slope efficiency is higher than when the amount of phase shift is $\pi$ radians. Accordingly, by setting the amount of phase shift not smaller than $1.5\pi$ radians but not larger than $1.83\pi$ radians, higher slope efficiencies can be achieved than when the amount of phase shift is $\pi$ radians.

Figure 13:
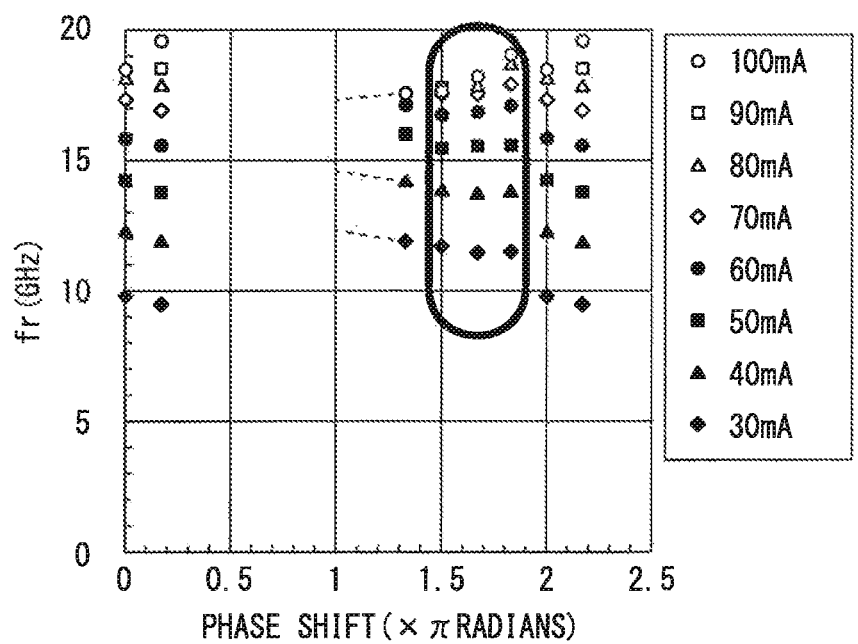
FIG. 13 is a diagram illustrating the relationship between relaxation oscillation frequency fr and amount of phase shift.

FIG. 13 is a diagram illustrating the relationship between the relaxation oscillation frequency fr and the amount of phase shift.

When the amount of phase shift is in the range of $1.5\pi$ radians to $1.83\pi$ radians, higher relaxation oscillation frequencies fr can be obtained even at low drive current values than when the amount of phase shift is 0 radians. Further, when the amount of phase shift is in the range of $1.5\pi$ radians to $1.83\pi$ radians, it is believed that relaxation oscillation frequencies fr equal to or higher than those (extrapolated values in FIG. 13) when the amount of phase shift is $\pi$ radians can be obtained. Accordingly, when the amount of phase shift is set not smaller than $1.5\pi$ radians but not larger than $1.83\pi$ radians, since high relaxation oscillation frequencies fr can be obtained even at low drive current values, and hence a wider frequency band can be used, the power consumption of the optical semiconductor device can be reduced.

According to the optical semiconductor device 10 of the present embodiment described above, the tolerance to manufacturing variations, etc., is increased, and the occurrence of abnormal oscillation such as a mode jumping or mode contention is suppressed.

A monolithic optical semiconductor device array may be formed by arranging a plurality of optical semiconductor devices of the first embodiment on a single substrate.

Figure 14:
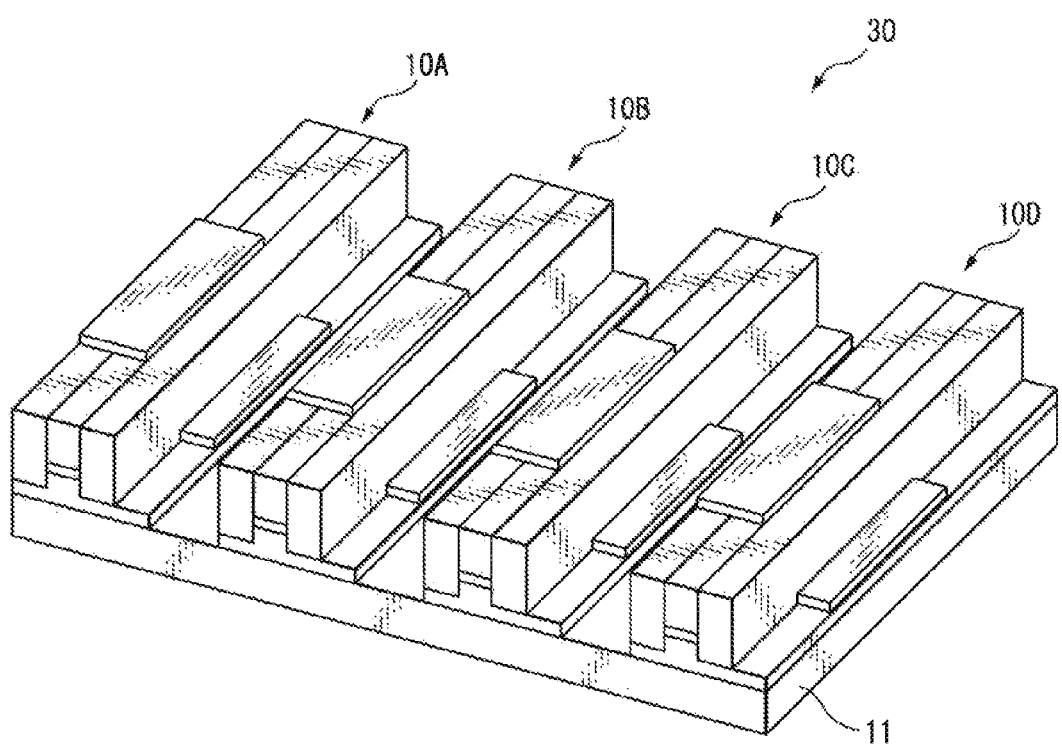
FIG. 14 is a diagram illustrating one embodiment of an optical semiconductor device array disclosed in this specification.

FIG. 14 is a diagram illustrating one embodiment of an optical semiconductor device array disclosed in this specification.

The optical semiconductor device array 30 is constructed from four optical semiconductor devices 10A to 10D arranged side by side on a single substrate 11. The optical semiconductor devices 10A to 10D each have the same structure as the optical semiconductor device of the foregoing first embodiment. The optical semiconductor devices 10A to 10D are arranged side by side on the single substrate 11 with their optical axes oriented in the same direction. The structure of each of the optical semiconductor devices 10A to 100 is depicted in simplified form compared with that of the optical semiconductor device depicted in FIGS. 4 to 7.

If the four optical semiconductor devices 10A to 10B are constructed to oscillate at respectively different wavelengths, the optical semiconductor device array 30 can be operated to emit laser light simultaneously at four different wavelengths.

According to the optical semiconductor device array 30 of the present embodiment, each individual optical semiconductor device has high tolerance to manufacturing variations, etc., and is capable of suppressing the occurrence of abnormal oscillation. Since the fabrication yield of the optical semiconductor devices 10A to 10B forming the optical semiconductor device array 30 is high, the optical, semiconductor device array can be produced with high yield.

Other embodiments of the optical semiconductor device described above will be described below with reference to drawings. In all aspects not specifically described otherwise, the detailed description given of the foregoing first embodiment also applies to the other embodiments. Further, the same component elements are designated by the same reference numerals.

Figure 15:
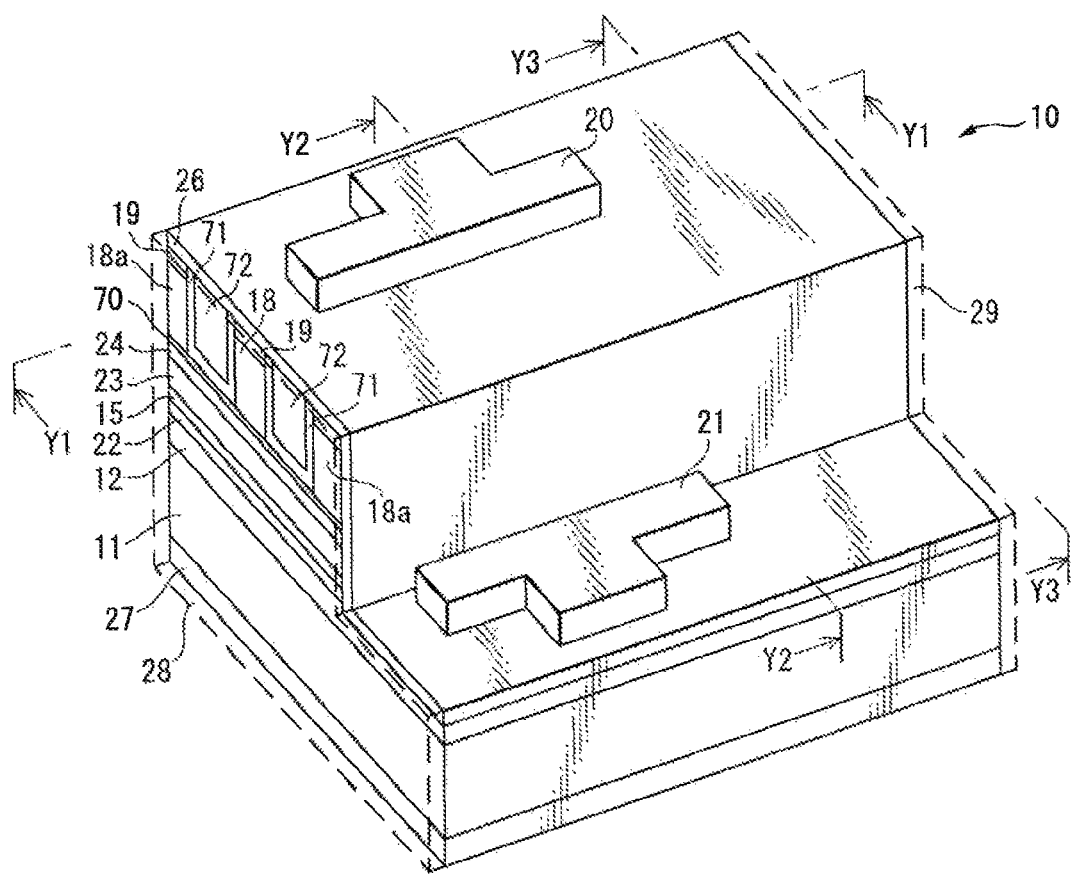
FIG. 15 is a perspective view illustrating a second embodiment of the optical semiconductor device disclosed in this specification.
Figure 16:
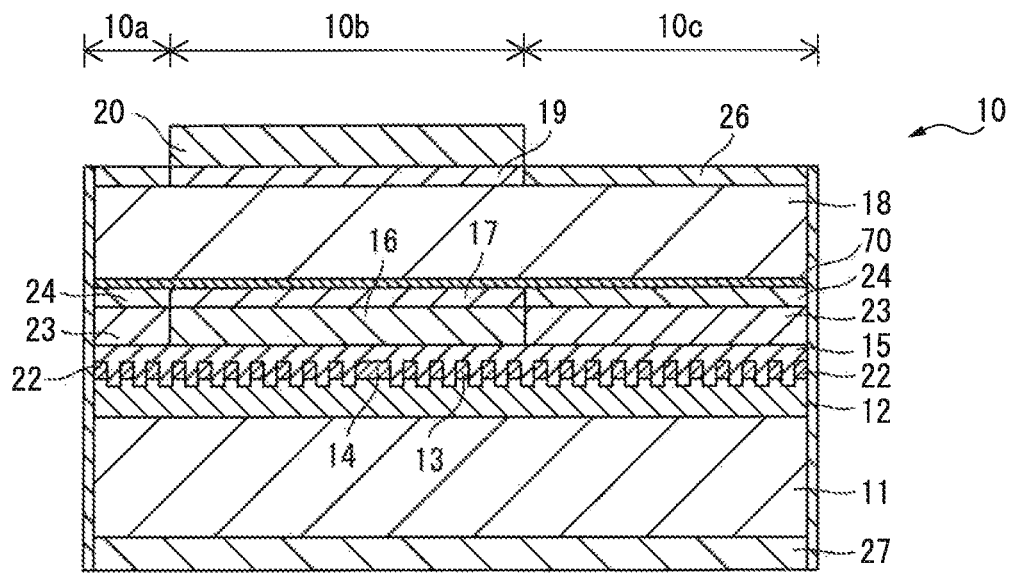
FIG. 16 is a cross-sectional view taken along line Y1-Y1 in FIG. 15.
Figure 17:
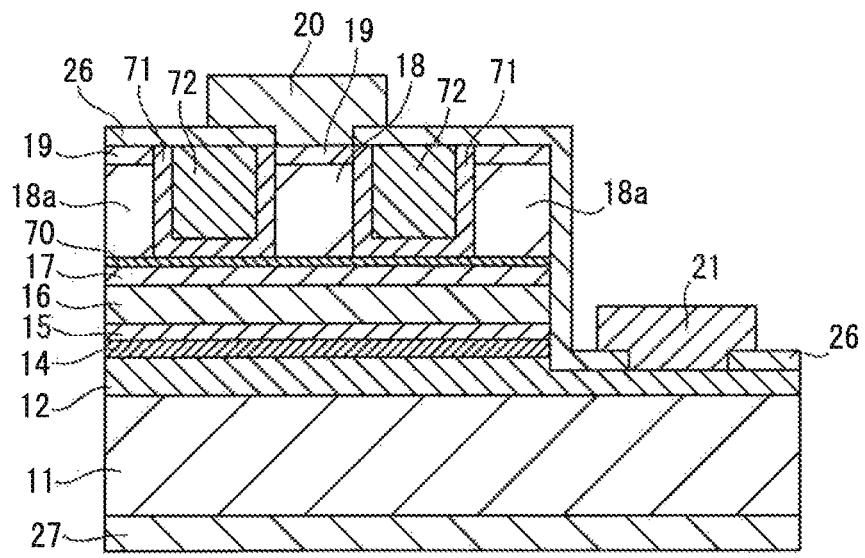
FIG. 17 is a cross-sectional view taken along line Y2-Y2 in FIG. 15.
Figure 18:
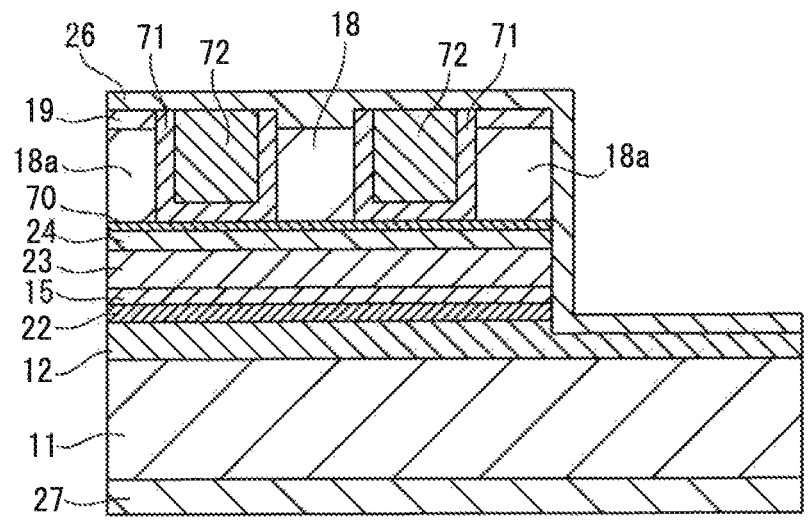
FIG. 18 is a cross-sectional view taken along line Y3-Y3 in FIG. 15.

FIG. 15 is a perspective view illustrating a second embodiment of the optical, semiconductor device disclosed in this specification. FIG. 16 is a cross-sectional view taken along line Y1-Y1 in FIG. 15. FIG. 17 is a cross-sectional view taken along line Y2-Y2 in FIG. 15. FIG. 18 is a cross-sectional view taken along line Y3-Y3 in FIG. 15.

The optical semiconductor device 10 of the present embodiment, similarly to the foregoing first embodiment, is a DR laser which includes a first distributed reflection mirror region 10a, an active region 10b, and a second distributed reflection mirror region 10c.

The optical semiconductor device 10 of the present embodiment has a so-called ridge-type structure. In the optical semiconductor device 10 of the present embodiment, the second upper cladding layer 18 extending along the direction of the optical axis is located above the active layer 16. The second upper cladding layer 18 is flanked on both sides by embedded layers 72 whose refractive index is lower than that of the second upper cladding layer 18, and the active layer 16 extends under the embedded layers 72.

The optical semiconductor device 10 will be described in further detail below.

The active region 10b includes a substrate 11, a first lower cladding layer 12 formed on the substrate 11, a first diffraction grating layer 13 formed on the first lower cladding layer 12 and having a diffraction grating with a prescribed grating period, and a phase shift portion 14, formed within the first diffraction grating layer 13, for shifting the phase of the light propagating through the active region 10b. The substrate 11 and the first lower cladding layer 12 both extend into the first and second distributed reflection mirror regions 10a and 10c.

The phase shift portion 14 provides a phase shift not smaller than $1.5\pi$ radians but not larger than $1.83\pi$ radians. Preferably, the phase shift portion 14 is formed in an area within the active region 10b where light concentration is high so that laser light of the desired wavelength can be generated efficiently.

A second lower cladding layer 15 is formed on the first diffraction grating layer 13. The diffraction grating forming the first diffraction grating layer 13 is embedded between the first lower cladding layer 12 and the second lower cladding layer 15, thus forming a so-called embedded diffraction grating. The second lower cladding layer 15 extends into the first and second distributed reflection mirror regions 10a and 10c.

The active layer 16 which produces light when current is injected into it is formed on the second lower cladding layer 15. A quantum well structure or a bulk structure can be used for the active layer 16. A compound semiconductor or the like can be used as the material for forming the active layer 16.

A first upper cladding layer 17 is formed on the active layer 16. An etch stop layer 70 is formed on the first upper cladding layer 17. The etch stop layer 70 extends into the first and second distributed reflection mirror regions 10*a* and 10*c*. The second upper cladding layer 18 extending along the direction of the optical axis is formed on the etch stop layer 70. The second upper cladding layer 18 extends along the direction of the optical axis into the first and second distributed reflection mirror regions 10*a* and 10*c*. A contact layer 19 is formed on the second upper cladding layer 18. A first electrode layer 20 is formed on the contact layer 19.

When viewed along a direction crossing at right angles to the direction of the optical axis, the substrate 11, the first lower cladding layer 12, the first diffraction grating layer 13, the second lower cladding layer 15, the phase shift portion 14, the active layer 16, the first upper cladding layer 17, and the etch stop layer 70 extend under the second upper cladding layer 18 and the embedded layers 72.

The pair of embedded layers 72 is disposed so as to sandwich the second upper cladding layer 18 by interposing a passivation layer 71 therebetween. Preferably, the embedded layers 72 have a lower refractive index than the second upper cladding layer 18 and have electrically semi-insulating or insulating properties. The embedded layers 72 can be formed, for example, from benzocyclobutene (BCB).

The passivation layer 71 is interposed between each embedded layer 72 and the etch stop layer 70 and second upper cladding layer 18. The embedded layers 72 also extend along the direction of the optical axis and in parallel with the second upper cladding layer 18 into the first and second distributed reflection mirror regions 10*a* and 10*c*.

On the side of each embedded layer 72 opposite from the side on which the second upper cladding layer 18 is formed, there is formed a fourth upper cladding layer 18*a* by interposing the passivation layer 71 therebetween. The fourth upper cladding layers 18*a* extend in parallel with the embedded layers 72 into the first and second distributed reflection mirror regions 10*a* and 10*c*.

When viewed along a direction crossing at right angles to the direction of the optical axis, the substrate 11 and the first lower cladding layer 12 further extend outwardly from under one of the fourth upper cladding layers 18*a*. A second electrode layer 21 is formed on the portion of the first lower cladding layer 12 that extends outwardly from this fourth upper cladding layer 18*a*.

The first and second electrode layers 20 and 21 act to inject current into the active layer 16.

The underside of the substrate 11 is covered with a bonding layer 27 for bonding to another member.

The first and second distributed reflection mirror regions 10*a* and 10*c* each include a second diffraction grating layer 22 formed on the first lower cladding layer 12, and the second lower cladding layer 15 formed on the second diffraction grating layer 22. An optical guide layer 23 is formed on the second lower cladding layer 15. The optical guide layer 23 is optically coupled to the active layer 16. A third upper cladding layer 24 is formed on the optical guide layer 23 and is covered with the etch stop layer 70, and the second upper cladding layer 18 is formed on the etch stop layer 70.

Each of the above layers is covered with a passivation layer 26.

The second diffraction grating layer 22 has a diffraction grating having the same grating period as that of the first diffraction grating layer 13. From the standpoint that the first and second distributed reflection mirror regions 10*a* and 10*c* have the same beam coupling coefficient as the active region 10*b*, it is preferable that the depth of grooves forming the diffraction grating of the second diffraction grating layer 22 is made the same as that of grooves forming the diffraction grating of the first diffraction grating layer 13. In the optical semiconductor device 10, the second diffraction grating layer 22 is formed integrally with the first diffraction grating layer 13.

A first antireflection layer 28 is applied to cover an open end of the first distributed reflection mirror region 10*a*, and a second antireflection layer 29 is applied to cover an open end of the second distributed reflection mirror region 10*c*. In FIG. 15, the first and second antireflection layers 28 and 29 are indicated by dashed lines.

In the present embodiment described above, since the phase shift portion 14 is formed so as to provide a phase shift not smaller than $1.5\pi$ radians but not larger than $1.83\pi$ radians, as in the foregoing first embodiment, the optical semiconductor device 10 offers the same effect as that achieved by the optical semiconductor device of the first embodiment.

Figure 19:
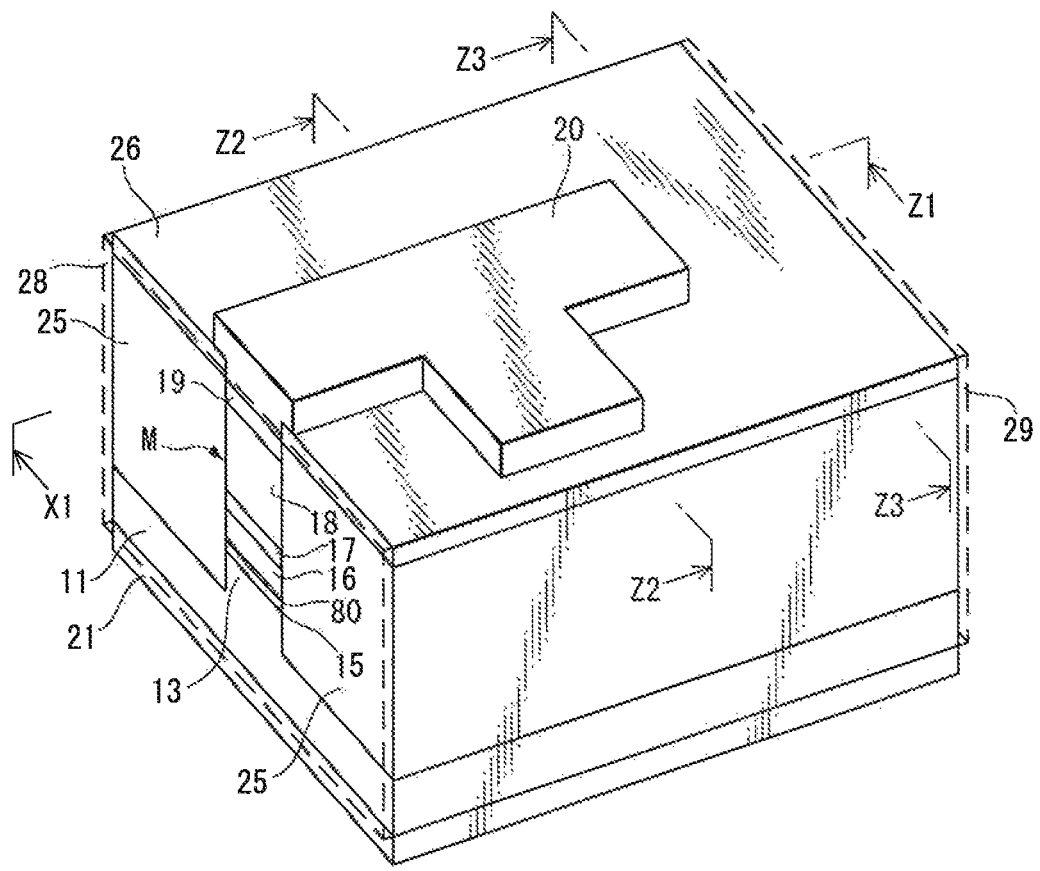
FIG. 19 is a perspective view illustrating a third embodiment of the optical semiconductor device disclosed in this specification.
Figure 20:
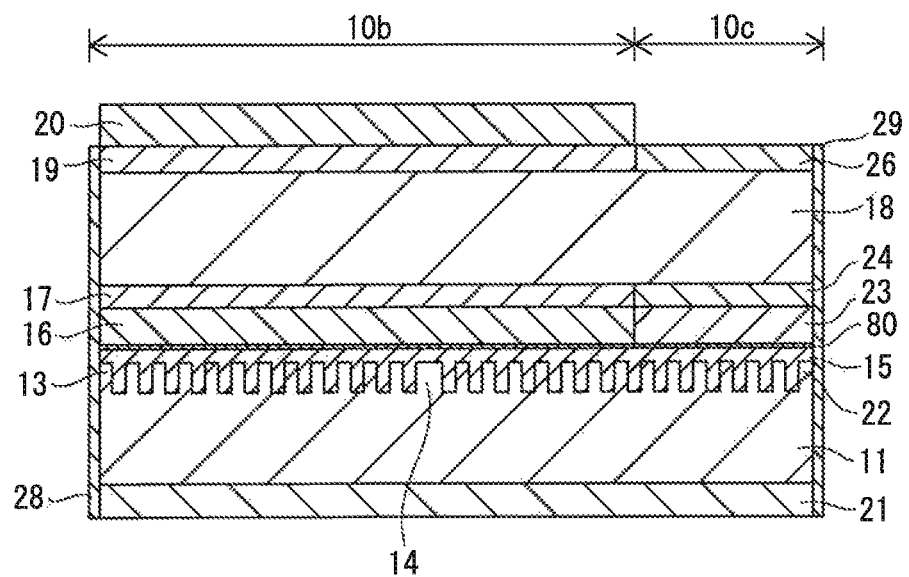
FIG. 20 is a cross-sectional view taken along line Z1-Z1 in FIG. 19.
Figure 21:
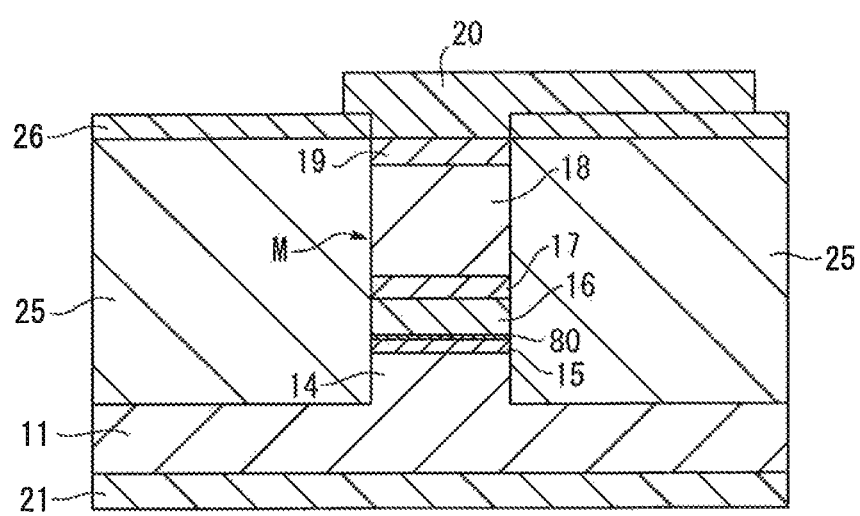
FIG. 21 is a cross-sectional view taken along line Z2-Z2 in FIG. 19.
Figure 22:
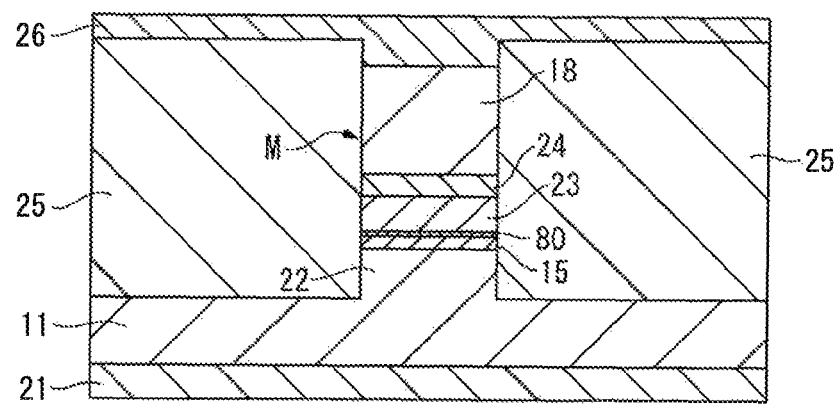
FIG. 22 is a cross-sectional view taken along line Z3-Z3 in FIG. 19.

FIG. 19 is a perspective view illustrating a third embodiment of the optical semiconductor device disclosed in this specification. FIG. 20 is a cross-sectional view taken along line Z1-Z1 in FIG. 19. FIG. 21 is a cross-sectional view taken along line Z2-Z2 in FIG. 19. FIG. 22 is a cross-sectional view taken along line Z3-Z3 in FIG. 19.

The optical semiconductor device 10 of the present embodiment is a DR laser which includes an active region 10*b* and a second distributed reflection mirror region 10*c*. The optical semiconductor device 10 of the present embodiment differs from the earlier described first embodiment by the omission of the first distributed reflection mirror region.

The optical semiconductor device 10 includes a mesa portion M extending along the direction of the optical axis and current-blocking buried layers 25 burying the mesa portion M from both sides thereof, and thus has a so-called buried heterostructure.

The optical semiconductor device 10 will be described in further detail below.

The active region 10b includes a substrate 11, a first diffraction grating layer 13 formed on the substrate 11 and having a diffraction grating with a prescribed grating period, and a phase shift portion 14, formed within the first diffraction grating layer 13, for shifting the phase of the light propagating through the active region 10*b*. The substrate 11 extends into the first and second distributed reflection mirror regions 10*a* and 10*c*. The optical semiconductor device 10 of the present embodiment differs from the earlier described first embodiment by the omission of the first lower cladding layer.

The phase shift portion 14 provides a phase shift not smaller than $1.5\pi$ radians but not larger than $1.83\pi$ radians. Preferably, the phase shift portion 14 is formed in an area within the active region 10*b* where light concentration is high so that laser light of the desired wavelength can be generated efficiently.

In the present embodiment, the first diffraction grating layer 13 and the phase shift portion 14 are formed by processing the surface of the substrate 11, which thus has a so-called surface diffraction grating structure. The substrate 11 can be constructed from a compound semiconductor substrate of p-type or n-type conductivity.

A second lower cladding layer 15 is formed on the first diffraction grating layer 13. The second lower cladding layer 15 extends into the second distributed reflection mirror region 10c.

An etch stop layer 80 is formed on the second lower cladding layer 15. An active layer 16 which produces light when current is injected into it is formed on the etch stop layer 80. A quantum well structure or a bulk structure can be used for the active layer 16. A compound semiconductor or the like can be used as the material for forming the active layer 16. The etch stop layer 80 extends into the second distributed reflection mirror region 10c.

A first upper cladding layer 17 is formed on the active layer 16. A second upper cladding layer 18 extending along the direction of the optical axis is formed on the first upper cladding layer 17. The second upper cladding layer 18 extends along the direction of the optical axis into the second distributed reflection mirror region 10a, 10c. A contact layer 19 is formed on the second upper cladding layer 18. A first electrode layer 20 is formed on the contact layer 19.

When viewed along a direction crossing at right angles to the direction of the optical axis, the substrate 11 extends under the mesa portion M and the current-blocking layers 25.

A second electrode layer 21 is formed on the underside of the substrate 11.

The first and second electrode layers 20 and 21 act to inject current into the active layer 16.

The second distributed reflection mirror region 10c includes a second diffraction grating layer 22 formed on the substrate 11, and the second lower cladding layer 15 formed on the second diffraction grating layer 22. The etch stop layer 80 is formed on the second lower cladding layer 15. An optical guide layer 23 is formed on the etch stop layer 80. The optical guide layer 23 is optically coupled to the active layer 16. A third upper cladding layer 24 is formed on the optical guide layer 23, and the second upper cladding layer 18 is formed on the third upper cladding layer 24.

The second diffraction grating layer 22 has a diffraction grating having the same grating period as that of the first diffraction grating layer 13. From the standpoint that the second distributed reflection mirror region 10c has the same beam coupling coefficient as the active region 10b, it is preferable that the depth of grooves forming the diffraction grating of the second diffraction grating layer 22 is made the same as that of grooves forming the diffraction grating of the first diffraction grating layer 13. In the optical semiconductor device 10, the second diffraction grating layer 22 is formed integrally with the first diffraction grating layer 13 by processing the surface of the substrate 11.

A first antireflection layer 28 is applied to cover an open end of the active region 10b, and a second antireflection layer 29 is applied to cover an open end of the second distributed reflection mirror region 10c. In FIG. 19, the first and second antireflection layers 28 and 29 are indicated by dashed lines.

The mesa portion M is formed from a portion left on the surface containing the first and second diffraction orating layers 13 and 22 in the active region 10b and the second distributed reflection mirror region 10c. The mesa portion M extends through the active region 10b and the second distributed reflection mirror region 10c. The active region 16 and the optical guide layer 23 are contained in the mesa portion M. Preferably, the buried layers 25 have electrically semi-insulating or insulating properties, and act to inject the current into the active region 16.

The mesas portion M and the buried layers 25 are covered with a passivation layer 26.

In the present embodiment described above, since the phase shift portion 14 is formed so as to provide a phase shift not smaller than $1.5\pi$ radians but not larger than $1.83\pi$ radians, as in the earlier described first embodiment, the optical semiconductor device 10 offers the same effect as that achieved by the optical semiconductor device of the first embodiment.

A monolithic optical semiconductor device array may be formed by arranging a plurality of optical semiconductor devices of the third embodiment on a single substrate.

Figure 23:
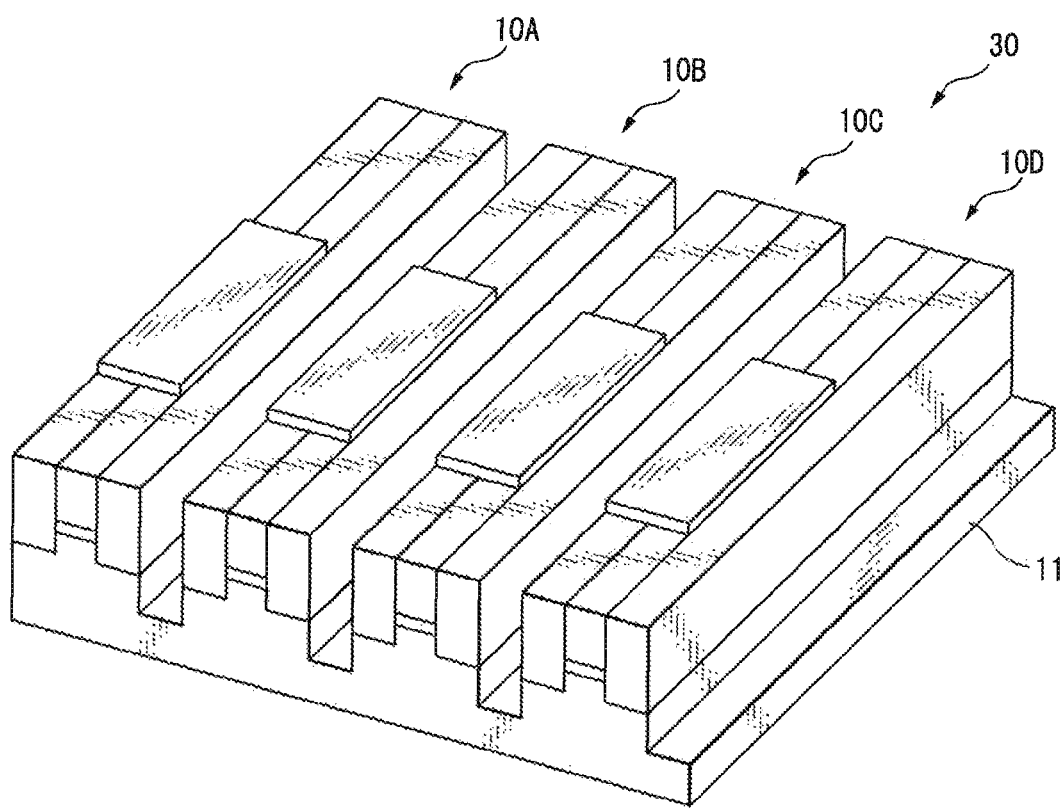
FIG. 23 is a diagram illustrating another embodiment of an optical semiconductor device array disclosed in this specification.

FIG. 23 is a diagram illustrating one embodiment of an optical semiconductor device array disclosed in this specification.

The optical semiconductor device array 30 is constructed from four optical semiconductor devices 10A to 10D arranged side by side on a single substrate 11. The optical semiconductor devices 10A to 10D each have the same structure as the optical semiconductor device of the third embodiment described above. The optical semiconductor devices 10A to 10D are arranged side by side on the single substrate 11 with their optical axes oriented in the same direction. The structure of each of the optical semiconductor devices 10A to 10D is depicted in simplified form compared with that of the optical semiconductor device depicted in FIGS. 19 to 22.

If the optical semiconductor devices 10A to 10B are constructed to oscillate at respectively different wavelengths, the optical semiconductor device array 30 can be operated to emit laser light simultaneously at four different wavelengths.

According to the present embodiment, since the optical semiconductor devices 10A to 10B forming the optical semiconductor device array 30 have high tolerance to manufacturing variations, etc., and have high fabrication yield, the optical semiconductor device array can be produced with high yield.

Alternatively, the optical semiconductor device array may be formed by arranging a plurality of optical semiconductor devices of the earlier described second embodiment.

It is also possible to fabricate a monolithic integrated device using the optical semiconductor devices or the optical semiconductor device array disclosed in this specification.

Figure 24:
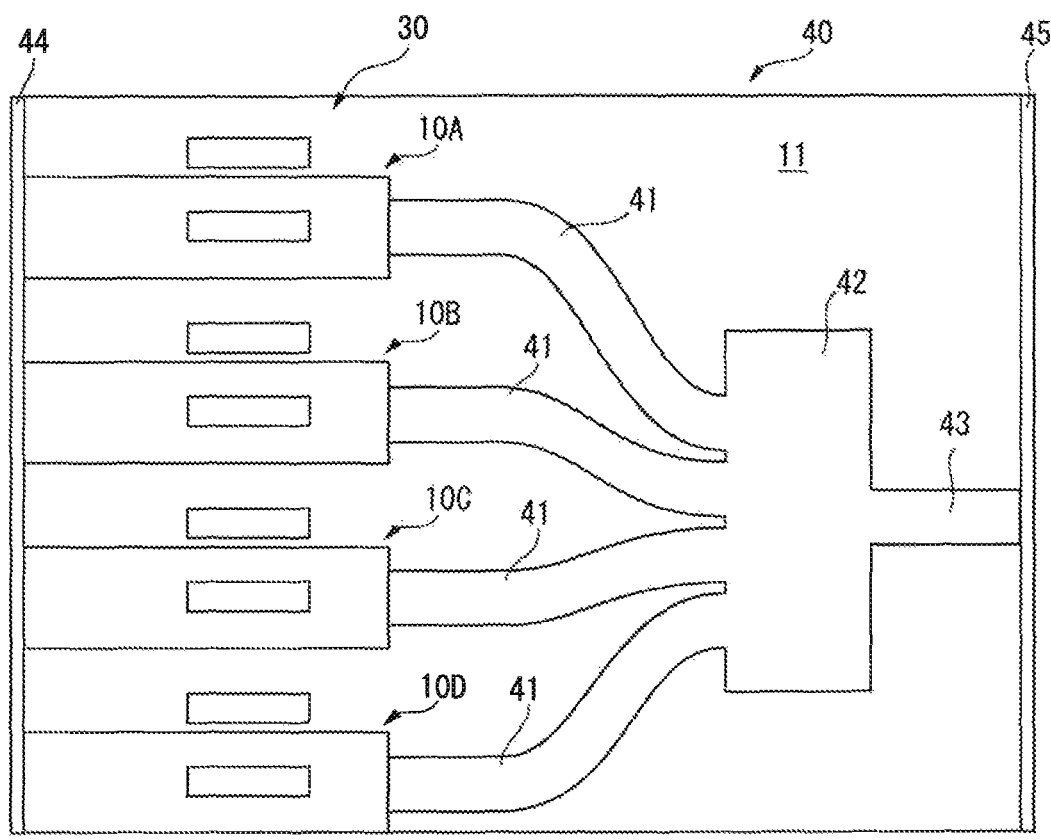
FIG. 24 is a diagram illustrating one embodiment of an integrated device disclosed in this specification.

FIG. 24 is a diagram illustrating one embodiment of an integrated device disclosed in this specification.

The integrated device 40 of the present embodiment includes an optical semiconductor device array 30 which is formed on a substrate 11, and optical waveguides 41 which are also formed on the substrate 11 and through each of which laser light output from a corresponding one of optical semiconductor devices 10A to 10D propagates.

The integrated device 40 further includes an. optical coupler 42, formed on the substrate 11, for combining the laser light propagated through the respective optical waveguides 41, and an optical waveguide 43, formed on the substrate 11, for guiding therethrough the combined laser light output from the optical coupler 42. The optical coupler 42 can be constructed using, for example, an MMI coupler or an AWG coupler.

The open end faces of the optical semiconductor devices 10A to 10D are covered with a first antireflective layer 44, while the open end face of the optical waveguide 43 is covered with a second. antireflective layer 45.

According to the integrated device 40 of the present embodiment described above, since the optical semiconductor device array used has high yield, the integrated device can be produced with high yield, and a wavelength-division multiplexed signal can be generated based on the laser light output from the respective optical semiconductor devices.

It is also possible to fabricate a transmitter/receiver module pair using the optical semiconductor devices or optical semiconductor device array or the integrated device disclosed in this specification.

Figure 25:
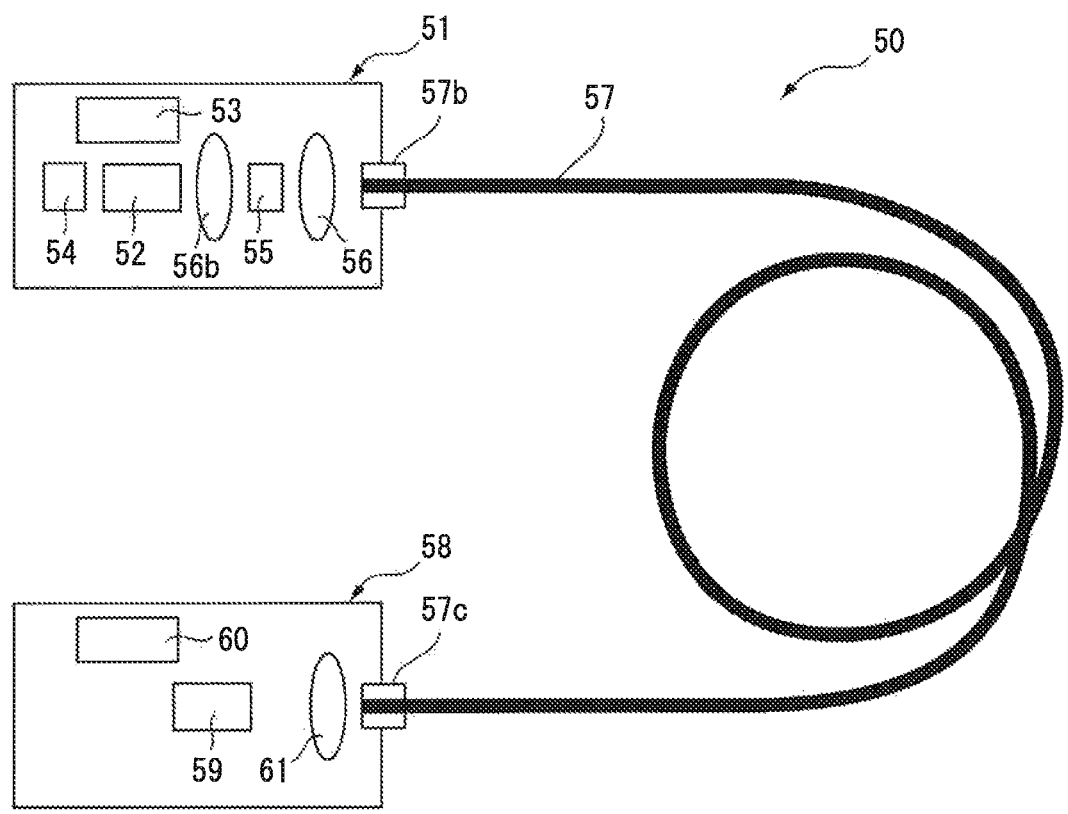
FIG. 25 is a diagram illustrating one embodiment of an optical transmitter/receiver module pair disclosed in this specification.

FIG. 25 is a diagram illustrating one embodiment of an optical transmitter/receiver module pair disclosed in this specification.

The optical transmitter/receiver module pair 50 of the present embodiment includes an optical transmitter module 51, an optical fiber 57 through which light output from the optical transmitter module 51 is transmitted, and an optical receiver module 58 which receives the light transmitted through the optical fiber 57.

The optical transmitter module 51 includes an optical transmitter unit 52 having the same configuration as the integrated device depicted in FIG. 24, a driving unit 53 which supplies current to each optical semiconductor device contained in the optical transmitter unit 52, and lenses 56 and 56b for coupling the laser light output from the optical transmitter unit 52 into the optical fiber 57. Each optical semiconductor device in the optical transmitter unit 52 is directly modulated by the driving unit 53.

The optical transmitter module 51 further includes an isolator 55 which prevents reflected light from the optical fiber 57 from entering the optical transmitter unit 52, and a monitoring unit 54 which monitors the laser light being output from the optical transmitter unit 52.

The optical transmitter module 51 transmits directly modulated optical signals, output from the optical transmitter unit 52, into the optical fiber 57.

The optical receiver module 58 includes an optical receiver unit 59, a lens 61 which couples the laser light output from the optical fiber 57 into the optical receiver unit 59, and a driving unit 60 which drives the optical receiver unit 59.

According to the optical transmission system 50 of the present embodiment described above, wavelength-division multiplexed optical signals can be transmitted and received.

Next, one embodiment of a preferred fabrication method for the optical semiconductor device of the first embodiment described above will be described below with reference to drawings.

Figure 26:
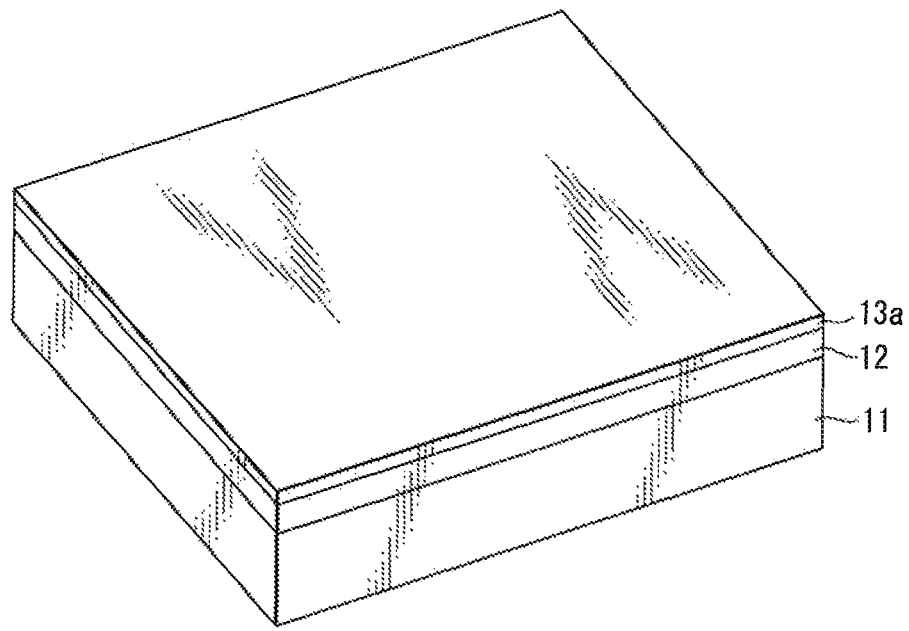
FIG. 26 is a diagram illustrating a step (part 1) in one embodiment of a fabrication method for the optical semiconductor device disclosed in this specification.

First, as depicted in FIG. 26, the first lower cladding layer 12 and a diffraction grating forming layer 13a are formed in this order on the substrate 11. In the present embodiment, a semi-insulating InP substrate was used as the substrate 11. Further, in the present embodiment, each layer was formed by using MOVPE. The first lower cladding layer 12 was formed using n-type doped InP; the thickness was 800 nm. The diffraction grating forming layer 13a was formed using n-type doped GaInAsP; the composition wavelength was 1150 nm and the thickness was 100 nm.

Figure 27:
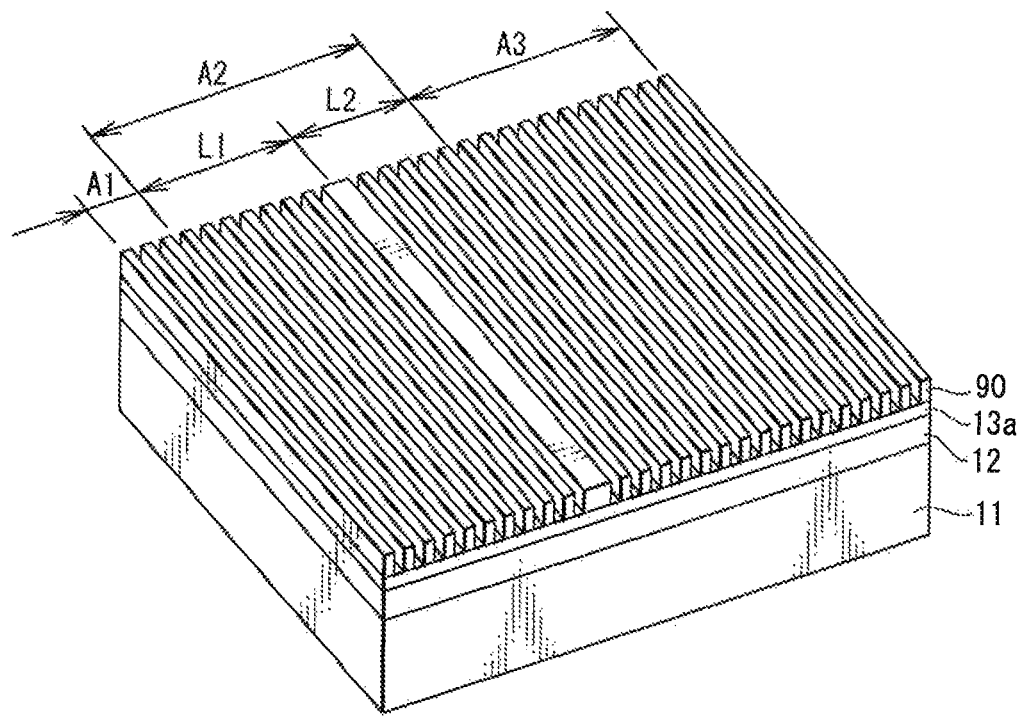
FIG. 27 is a diagram illustrating a step (part 2) in one embodiment of the fabrication method for the optical semiconductor device disclosed in this specification.

Next, as depicted in FIG. 27, a patterned mask 90 is formed on the diffraction grating forming layer 13a in order to form the first diffraction grating layer, the phase shift portion, and the second diffraction grating layer. In the present embodiment, the mask 90 was patterned using an electron beam exposure method. The size of the first region A1 where the first distributed reflection mirror region was to be formed was set to 25 μm, the size of the second region A2 where the active region was to be formed was set to 125 μm, and the size of the third region A3 where the second distributed reflection mirror region was to be formed was set to 100 μm. The mask portion for forming the phase shift portion was formed at a position whose distance L1 from the first region A1 was 85 μm so that the phase shift portion would provide a phase shift not smaller than 1.5π radians but not larger than 1.83π radians. The distance L2 from the third region A3 to the mask portion for forming the phase shift portion was 40 μm. The mask 90 was formed so that the first diffraction grating layer and the second diffraction grating layer would be formed so as to have a constant diffraction grating period of 199.505 nm.

Figure 28:
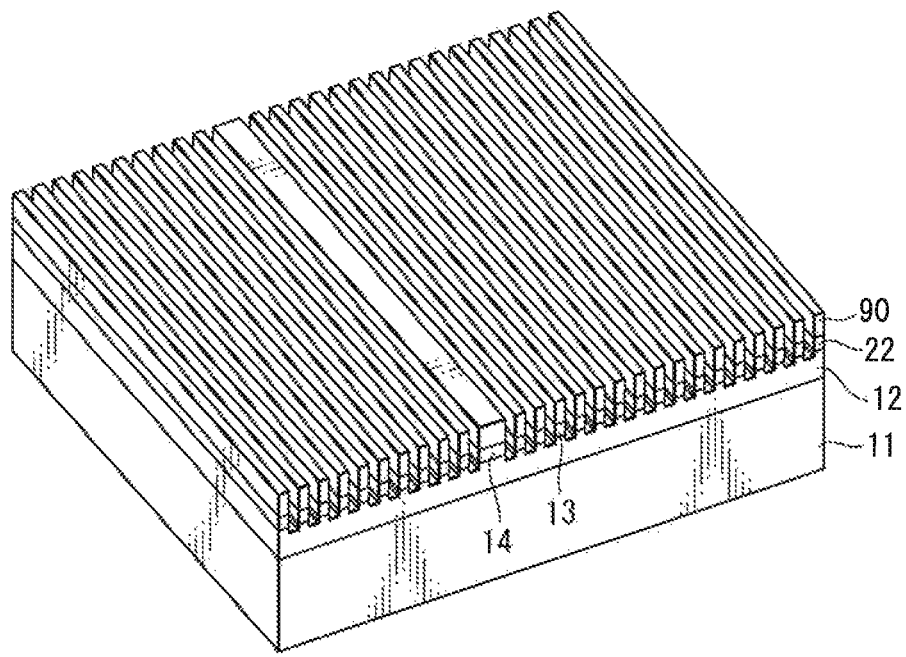
FIG. 28 is a diagram illustrating a step (part 3) in one embodiment of the fabrication method for the optical semiconductor device disclosed in this specification.

Next, as depicted in FIG. 28, the first diffraction grating layer 13, the phase shift portion 14, and the second diffraction grating layer 22 are formed using the mask 90 by etching through the diffracting grating forming layer 13a and removing portions of the first lower cladding layer 12. In the present embodiment, reactive ion etching (RIE) using an ethane/hydrogen gas mixture was used. The surface of the first lower cladding layer 12 was etched to a depth of 10 nm.

Figure 29:
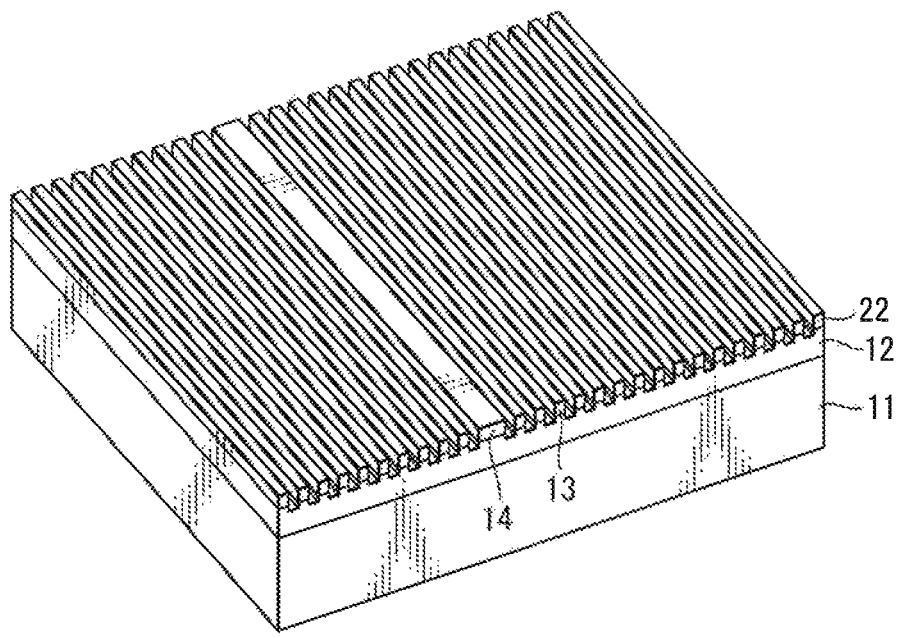
FIG. 29 is a diagram illustrating a step (part 4) in one embodiment of the fabrication method for the optical semiconductor device disclosed in this specification.

Then, as depicted in FIG. 29, the mask 90 is removed.

Figure 30:
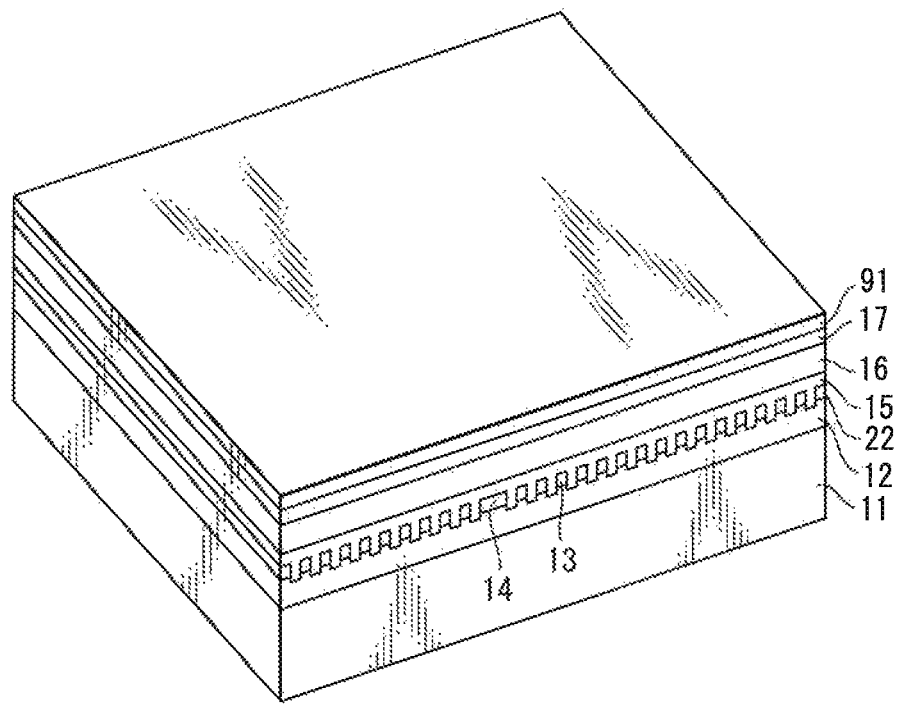
FIG. 30 is a diagram illustrating a step (part 5) in one embodiment of the fabrication method for the optical semiconductor device disclosed in this specification.

Next, as depicted in FIG. 30, the second lower cladding layer 15 is formed over the first diffraction grating layer 13, the phase shift portion 14, and the second diffraction grating layer 22 so as to fill the grooves of the first and second diffraction grating layers 13 and 22. Further, the active layer 16 and the first upper cladding layer 17 are formed in this order on top of the second lower cladding layer 15. In the present embodiment, each layer was formed by using MOVPE. The second lower cladding layer 15 was formed using n-type doped InP, and the thickness of the portion above the first and second diffraction grating layers 13 and 22 was 60 nm.

A quantum well structure was used for the active layer 16. In the present embodiment, the quantum well structure was formed using an undoped AlGaInAs well layer and an undoped AlGaInAs barrier layer. The undoped AlGaInAs well layer was formed to have a thickness of 4.2 nm and a compression strain of 1.0%. The undoped AlGaInAs barrier layer was formed to have a composition wavelength of 1.00 μm and a thickness of 10 nm. The quantum well structure was a 15-layer structure, and its oscillation wavelength was 1310 cm. Undoped AlGaInAs-SCH (Separate Confinement Heterostructure) layers were provided on the top and bottom of the quantum well structure in such a manner as to sandwich the quantum well structure therebetween. Each undoped AlGaInAs-SCH layer was formed to have a composition wavelength of 1.00 μm and a thickness of 20 nm.

Alternatively, for the quantum well structure, the undoped AlGaInAs well layer may be formed to have a thickness of 6.0 nm and a compression strain of 1.0%, and the undoped AlGaInAs barrier layer to have a composition wavelength of 1.05 μm and a thickness of 10 nm, and the quantum well structure may be formed by stacking 12 such layers one on top of another to achieve an oscillation wavelength of 1310 nm.

Further, for the quantum well structure, the well layer and the barrier layer may each be formed using GaInAsP.

The first upper cladding layer 17 was formed using p-type doped InP to a thickness of 200 nm.

Then, a mask 91 is formed on the first upper cladding layer 17. In the present embodiment, the mask 91 was formed by CVD using $SiO_2$ to a thickness of 400 nm.

Figure 31:
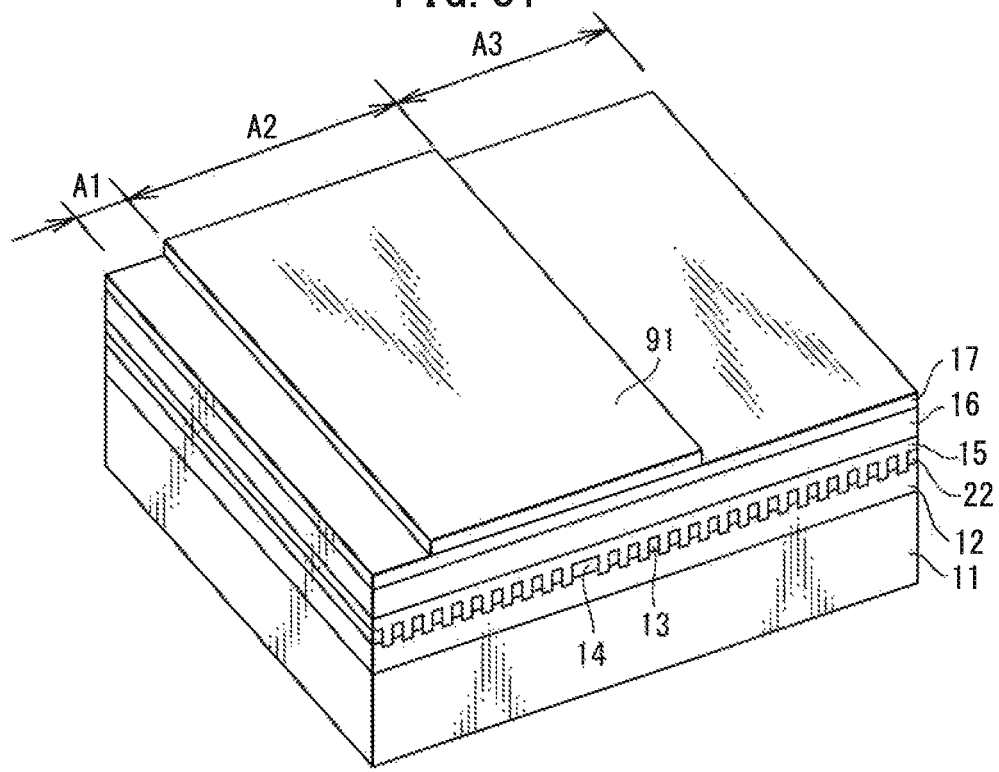
FIG. 31 is a diagram illustrating a step (part 6) in one embodiment of the fabrication method for the optical semiconductor device disclosed in this specification.

Next, as depicted in FIG. 31, the mask 91 is patterned by photolithography to form a mask pattern covering the second region A2.

Figure 32:
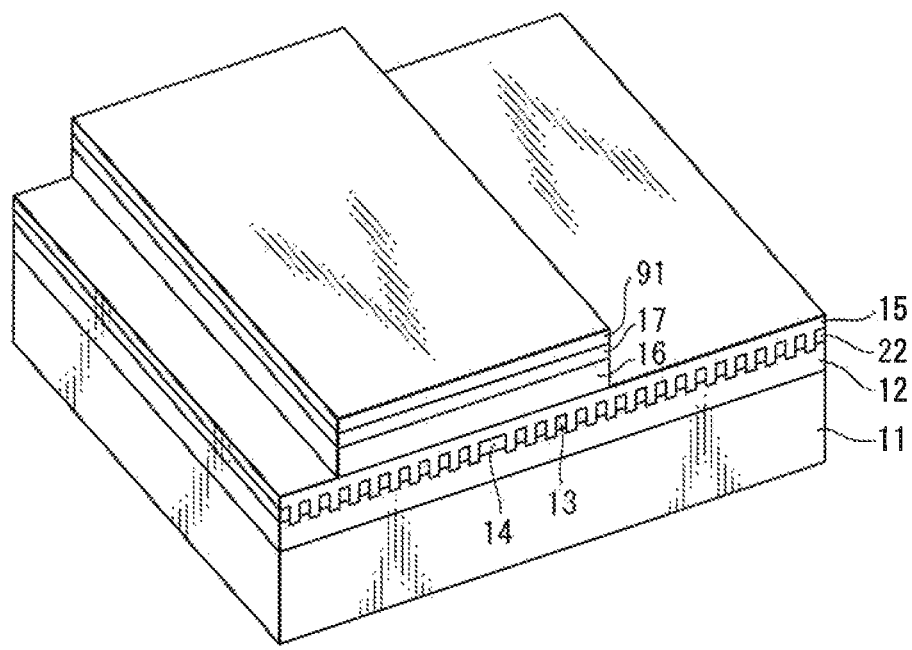
FIG. 32 is a diagram illustrating a step (part 7) in one embodiment of the fabrication method for the optical semiconductor device disclosed in this specification.

Next, as depicted in FIG. 32, using the mask 91, the portions of the first upper cladding layer 17 and active layer 16 that are not covered with the mask are removed by selective etching to expose the underlying second lower cladding layer 15.

Figure 33:
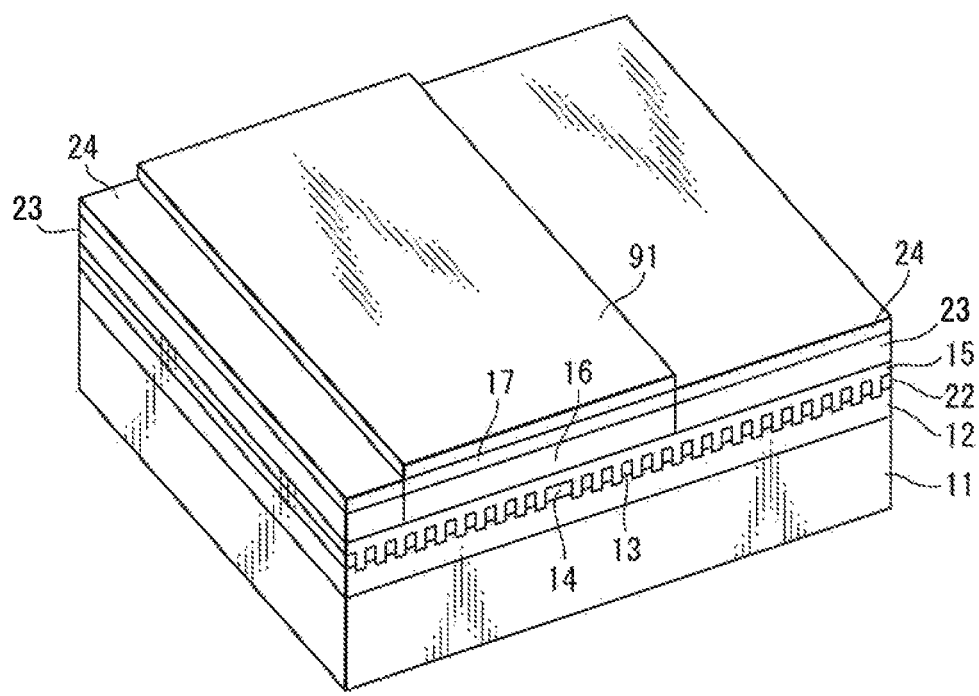
FIG. 33 is a diagram illustrating a step (part 8) in one embodiment of the fabrication method for the optical semiconductor device disclosed in this specification.

Then, as depicted in FIG. 33, the optical guide layer 23 and the third upper cladding layer 24 are formed in this order on the exposed second lower cladding layer 15. In the present embodiment, each layer was formed by using MOVPE. The active layer 16 and the optical guide layer 23 are joined together by butting one against the other. The first upper cladding layer 17 and the third upper cladding layer 24 are also joined together by butting one against the other. The optical guide layer 23 was formed using undoped GaInAsP with a composition wavelength of 1.20 μm and a thickness of 250 nm. The third upper cladding layer 24 was formed using undoped InP to a thickness of 200 nm. In this process, since the optical guide layer 23 and the third upper cladding layer 24 are formed by selective growth, these layers are not grown on the mask 91 formed of $SiO_2$. Then, the mask 91 is removed.

The optical guide layer 23 may be formed using undoped AlGaInAs with a composition wavelength of 1.15 μm and a thickness of 250 nm.

Figure 34:
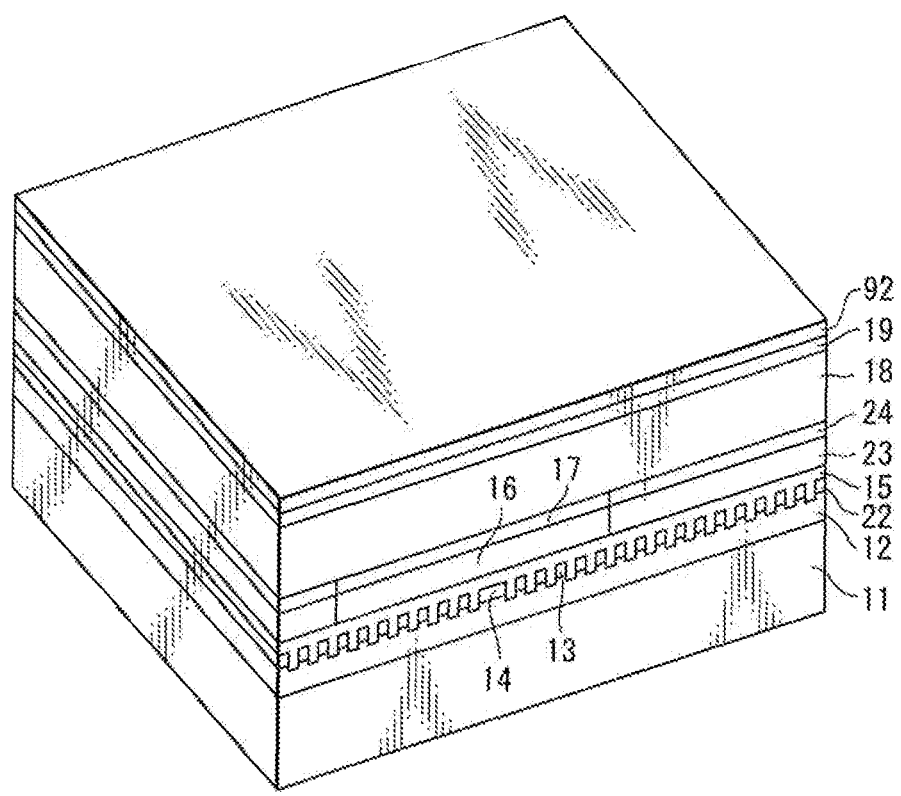
FIG. 34 is a diagram illustrating a step (part 9) in one embodiment of the fabrication method for the optical semiconductor device disclosed in this specification.

Next, as depicted in FIG. 34, the second upper cladding layer 18 and the contact layer 19 are formed in this order on the first and third upper cladding layers 17 and 24. In the present embodiment, each layer was formed by using MOVPE. The second upper cladding layer 18 was formed using Zn-doped p-type InP to a thickness of 2.5 μm. The contact layer 19 was formed using Zn-doped p-type GaInAs to a thickness of 300 nm. Then, a mask 92 is formed on the contact layer 19. In the present embodiment, the mask 92 was formed by CVD using $SiO_2$ to a thickness of 400 nm.

Figure 35:
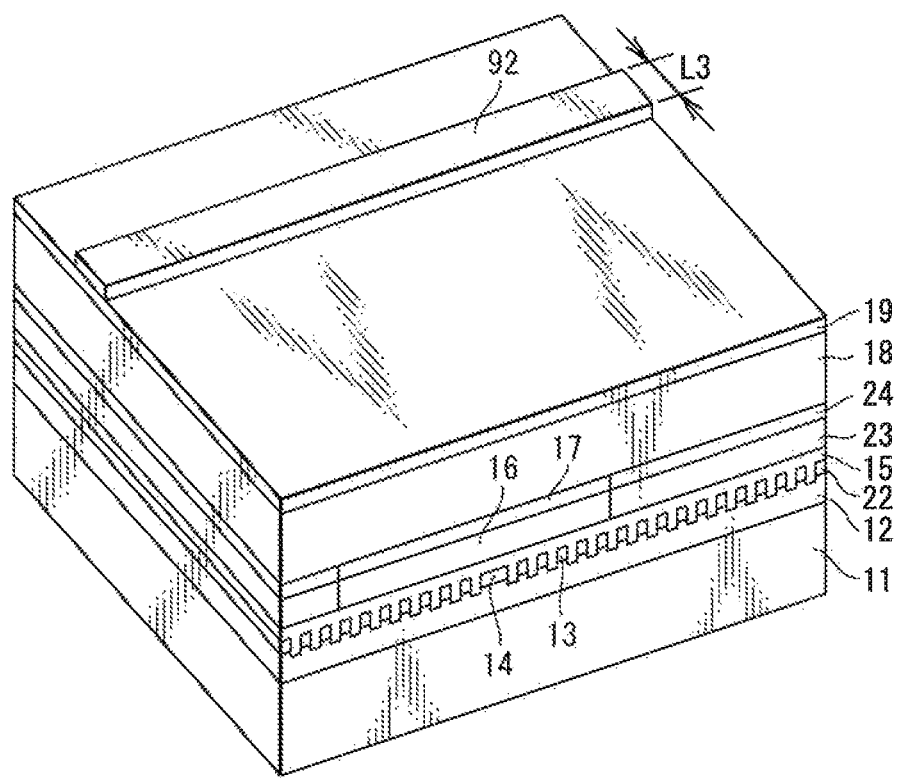
FIG. 35 is a diagram illustrating a step (part 10) in one embodiment of the fabrication method for the optical semiconductor device disclosed in this specification.

Next, as depicted in FIG. 35, the mask 92 is patterned in the shape of a stripe by photolithography in order to form a mesa portion. The mask 92 is patterned so that the stripe-shaped pattern extends along the entire length from the first region A1 to the third region A3. In the present embodiment, the mask 92 was patterned so that its width L3 was reduced to 1.3 μm.

Figure 36:
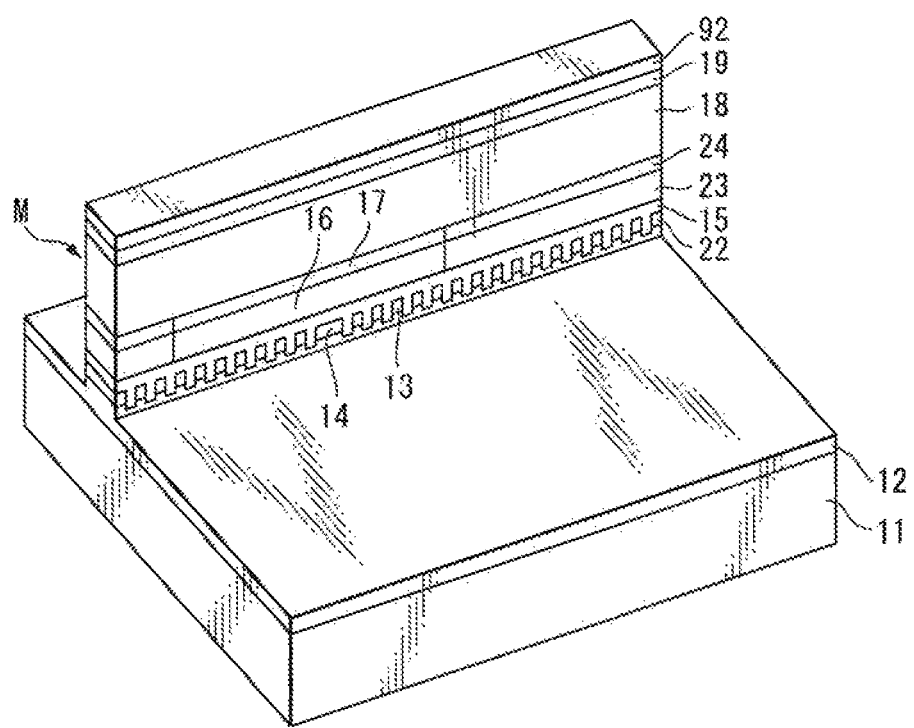
FIG. 36 is a diagram illustrating a step (part 11) in one embodiment of the fabrication method for the optical semiconductor device disclosed in this specification.

Next, as depicted in FIG. 36, using the mask 92, the portions of the contact layer 19 and underlying layers that are not covered with the mask are removed by dry etching through to the surface of the first lower cladding layer 12, to form the mesa portion M. In the present embodiment, the surface of the first lower cladding layer 12 was etched off to a depth of 300 nm.

Figure 37:
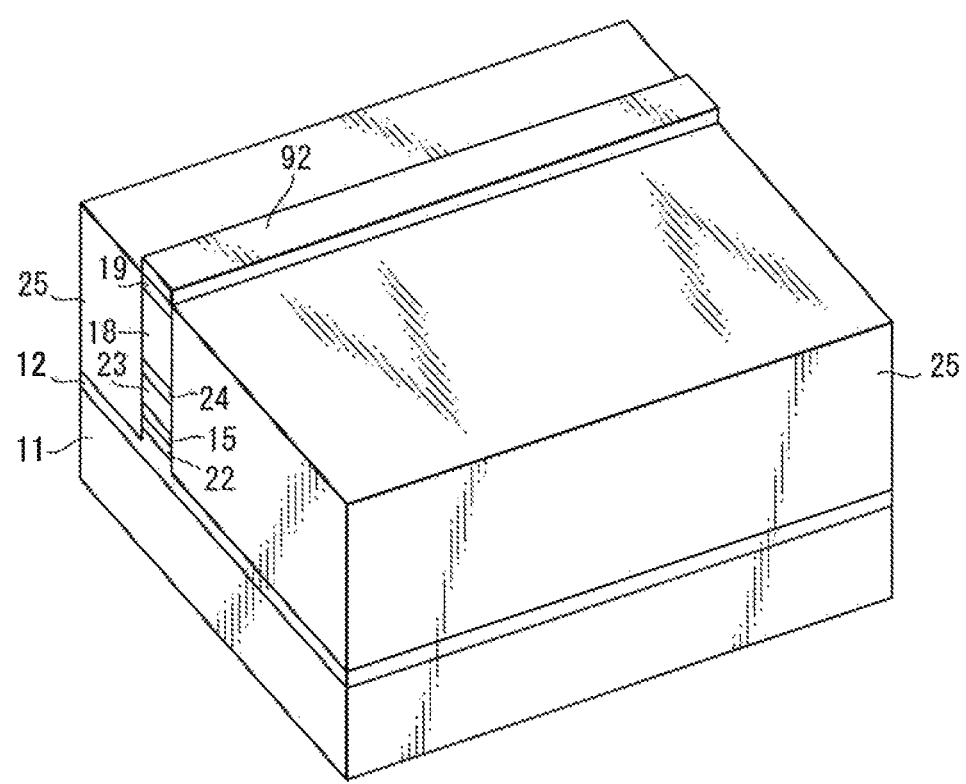
FIG. 37 is a diagram illustrating a step (part 12) in one embodiment of the fabrication method for the optical semiconductor device disclosed in this specification.

Then, as depicted In FIG. 37, the buried layers 25 are formed on the first lower cladding layer 12 so as to buried the side faces of the mesa portion M. In the present embodiment, the buried layers 25 were formed by using MOVPE. The buried layers 25 were formed using Fe-doped InP having semi-insulating properties. Then, the mask 92 is removed. In the present embodiment, the mask 92 was removed by using hydrofluoric acid.

Figure 38:
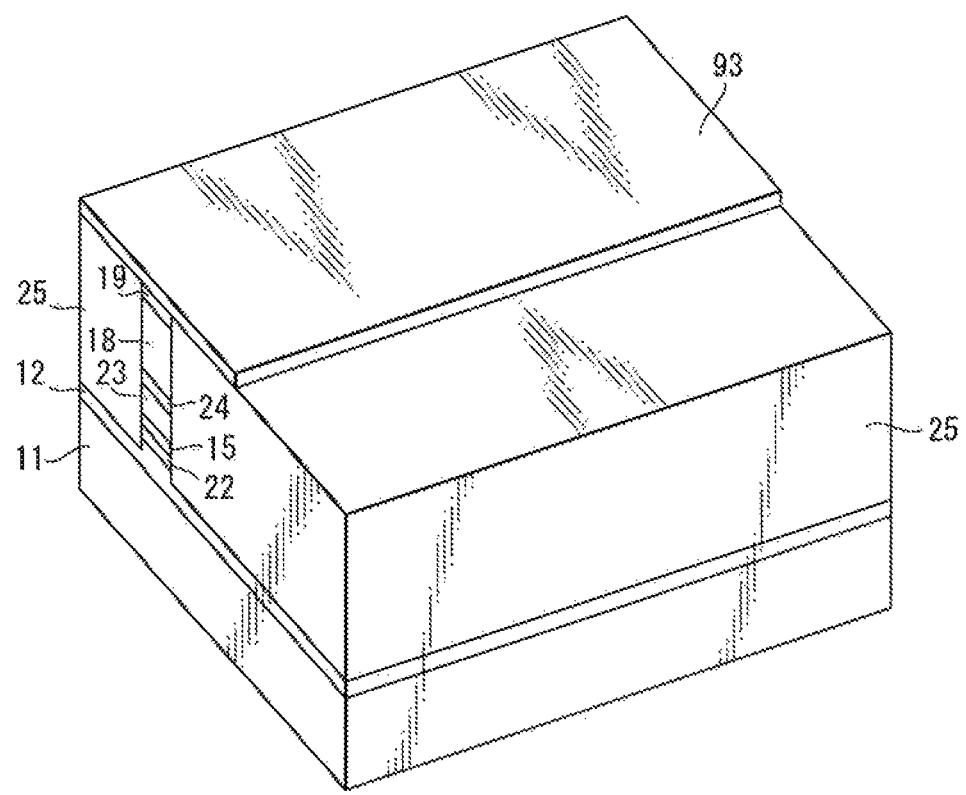
FIG. 38 is a diagram illustrating a step (part 13) in one embodiment of the fabrication method for the optical semiconductor device disclosed in this specification.

Next, as depicted in FIG. 38, using CVD or photolithography, a patterned mask 93 is formed so as to cover the mesa portion M and the designated portions of the buried layers 25 on both sides of the mesa portion M. In the present embodiment, the mask 93 was formed using $SiO_2$.

Figure 39:
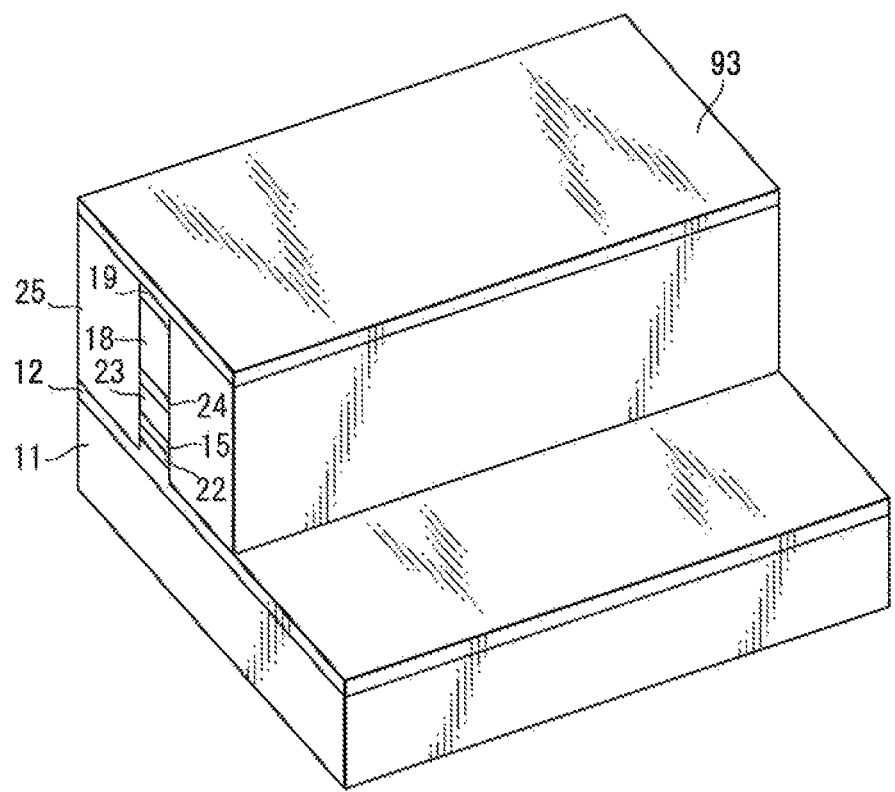
FIG. 39 is a diagram illustrating a step (part 14) in one embodiment of the fabrication method for the optical semiconductor device disclosed in this specification.

Next, as depicted in FIG. 39, using the mask 93, the portions of he buried layer 25 that are not covered with the mask are removed by drying etching to expose the underlying first lower cladding layer 12. Then, the mask 93 is removed.

Next, using photolithography, the contact layer 19 is etched away everywhere except the portion of the contact layer 19 located on the mesa portion M in the second region A2. Then, the passivation layer 26 is formed so as to cover the mesa portion M and the exposed portion of the first lower cladding layer 12. In the present embodiment, the passivation layer 26 was formed using SiN. Then, openings are formed in the passivation layer 26, and the first electrode layer 20 connecting to the contact layer 19 and the second electrode layer 21 connecting to the first lower cladding layer 12 are formed. Then, the bonding layer 27 is formed on the underside of the substrate 11. Further, the first antireflective layer 28 is formed on the open end face of the first region A1, and the second antireflective layer 29 on the open end face of the third region A3, to complete the fabrication of the optical semiconductor device of the first embodiment depicted in FIGS. 4 to 7.

In the present invention, the optical semiconductor device, the optical transmitter module, and the optical transmission system according to any one of the above embodiments can be modified in various ways without departing from the spirit and purpose of the present invention. Further, the constituent features of any one embodiment can be applied to the other embodiment where appropriate.

For example, the material used for forming the active layer or the optical guide layer in the optical semiconductor device fabrication method described above is only one example, and the active layer or the optical guide layer may be formed using some other suitable compound semiconductor or the like.

In the optical semiconductor device fabricated according to the optical semiconductor device fabrication method described above, the first and second lower cladding layers were formed with n-type conductivity, while the first and second upper cladding layers were formed with p-type conductivity, but these layers may be formed to have opposite conductivity type.

Further, in the optical semiconductor device fabrication method described above, an InP substrate was used, but instead, a GaAs substrate may be used. Further, the optical semiconductor device may be formed on a silicon substrate by using a laminating method.

While the optical semiconductor device according to any one of the above embodiments has been described as producing light at 1310-nm wavelength, the oscillation wavelength is not limited to any particular wavelength, but may be set appropriately according to the specific purpose for which it is intended.

Further, the optical semiconductor devices according to the first and third embodiments have each been described as having a heterostructure, but the optical semiconductor device may have a current-blocking structure of a pnpn thyristor configuration.

Further, the optical semiconductor devices according to the first and second embodiments have each been described as having an embedded diffraction grating, while the optical semiconductor device according to the third embodiment has been described as having a surface diffraction grating structure, but the structure of the diffraction grating is not limited to any particular type. The optical semiconductor devices of the first to third embodiments may have diffraction gratings of different structures.

In the optical semiconductor device according to each of the above embodiments, the first diffraction grating layer has been described as being formed on the substrate side of the active layer, but alternatively, the first diffraction grating layer may be formed on the opposite side of the active layer from the substrate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority and inferiority of the invention. Although the embodiments of the present invention have been described in detail, it should be understood that the various changes, substitutions, and alterations could be made hereto without departing from the spirit and scope of the invention.

What is claimed is:

1. A distributed reflection laser, comprising:
   an active region which includes an active layer which produces light when current is injected therein, a first diffraction grating layer having a first diffraction grating with a prescribed grating period, and a grating phase shift portion formed within the first diffraction grating layer, wherein the grating phase shift portion provides a grating phase shift not smaller than $1.57\pi$ but not larger than $1.83\pi$ and
   a first distributed reflection mirror region which is optically coupled to a first end of the active region as viewed along a direction of an optical axis, and which includes a second diffraction grating which has the same grating period as that of the first diffraction grating and reflects the light produced by the active region back into the active region; and
   a second distributed reflection mirror region which is optically coupled to a second end of the active region as viewed along the direction of the optical axis, and which includes a third diffraction grating which has the same grating period as that of the first diffraction grating and reflects the light produced by the active region back into the active region.

2. The distributed reflection laser according to claim 1, wherein the depth of grooves forming the second diffraction grating is the same as the depth of grooves forming the first diffraction grating.

3. The distributed reflection laser according to claim 1, wherein the depth of grooves forming the second diffraction grating is greater than the depth of grooves forming the first diffraction grating.

4. The distributed reflection laser according to claim 1, wherein the distributed reflection laser is provided with an antireflective layer at both ends as viewed along the direction of the optical axis.

5. The distributed reflection laser according to claim 1, wherein the grating phase shift that the phase shift portion provides is larger than $1.5\pi$.

6. A distributed reflection laser array, comprising:
   a substrate;
   a first distributed reflection laser unit arranged on the substrate, the first distributed reflection laser unit comprising
   a first active region which includes a first active layer which produces light when current is injected therein, a first diffraction grating layer having a first diffraction grating with a first grating period, and a first grating phase shift portion formed within the first diffraction grating layer, wherein the first grating phase shift portion provides a grating phase shift not smaller than $1.5\pi$ but not larger than $1.83\pi$,
   a first distributed reflection mirror region which is optically coupled to a first end of the first active region, and which includes a second diffraction grating which has the same grating period as that of the first diffraction grating and reflects the light produced by the first active region back into the first active region, and
   a second distributed reflection mirror region which is optically coupled to a second end of the first active region as viewed along the direction of the optical axis, and which includes a third diffraction grating which has the same grating period as that of the first diffraction grating and reflects the light produced by the first active region back into the first active region; and
   a second distributed reflection laser unit arranged side by side with the first distributed reflection laser unit on the substrate, the second distributed reflection laser unit comprising
   a second active region which includes a second active layer which produces light when current is injected therein, a fourth diffraction grating layer having a fourth diffraction grating with a second grating period, and a second grating phase shift portion formed within the fourth diffraction grating layer, wherein the second grating phase shift portion provides a grating phase shift not smaller than $1.57\pi$ but not larger than $1.837\pi$, and
   a third distributed reflection mirror region which is optically coupled to a first end of the second active region, and which includes a fifth diffraction grating which has the same grating period as that of the fourth diffraction grating and reflects the light produced by the second active region back into the second active region; and
   a fourth distributed reflection mirror region which is optically coupled to a second end of the second active region as viewed along the direction of the optical axis, and which includes a sixth diffraction grating which has the same grating period as that of the fourth diffraction grating and reflects the light produced by the second active region back into the second active region.

7. An optical transmitter module, comprising:
   a distributed reflection laser, the distributed reflection laser comprising
   an active region which includes an active layer which produces light when current is injected therein, a first diffraction grating layer having a first diffraction grating with a prescribed grating period, and a grating phase shift portion formed within the first diffraction grating layer, wherein the grating phase shift portion provides a grating phase shift not smaller than $1.57\pi$ but not larger than $1.83\pi$,
   a first distributed reflection mirror region which is optically coupled to a first end of the active region, and which includes a second diffraction grating which has the same grating period as the first diffraction grating and reflects the light produced by the active region back into the active region, and
   a second distributed reflection mirror region which is optically coupled to a second end of the active region as viewed along the direction of the optical axis, and which includes a third diffraction grating which has the same grating period as the first diffraction grating and reflects the light produced by the active region back into the active region; and
   a driving unit which injects current into the active layer.

8. The distributed reflection laser according to claim 1, wherein the distributed reflection laser comprises an electrode layer for injecting current into the active region and no current is injected into the first and second distributed reflection mirror regions.

9. The distributed reflection laser array according to claim 6, wherein the first distributed reflection laser unit comprises a first electrode layer for injecting current into the first active region, and the second distributed reflection laser unit comprises a second electrode layer for injecting current into the second active region and no current is injected into the first, second, third and fourth distributed reflection mirror regions.

10. The optical transmitter module according to claim 7, wherein the distributed reflection layer comprises an electrode layer for injecting current into the active region and no current is injected into the first and second distributed reflection mirror regions.

* * * * *